US011029352B2

(12) United States Patent
Blanc-Paques et al.

(10) Patent No.: US 11,029,352 B2
(45) Date of Patent: Jun. 8, 2021

(54) UNMANNED AERIAL VEHICLE ELECTROMAGNETIC AVOIDANCE AND UTILIZATION SYSTEM

(71) Applicant: Skydio, Inc., Redwood, CA (US)

(72) Inventors: Fabien Blanc-Paques, San Francisco, CA (US); Bernard J. Michini, San Francisco, CA (US); Mark Patrick Bauer, San Francisco, CA (US)

(73) Assignee: Skydio, Inc., Redwood City, CA (US)

( * ) Notice: Subject to any disclaimer, the term of this patent is extended or adjusted under 35 U.S.C. 154(b) by 12 days.

(21) Appl. No.: 15/598,204

(22) Filed: May 17, 2017

(65) Prior Publication Data

US 2017/0336806 A1 Nov. 23, 2017

Related U.S. Application Data

(60) Provisional application No. 62/338,291, filed on May 18, 2016.

(51) Int. Cl.
*G01R 29/08* (2006.01)
*G05D 1/00* (2006.01)
(Continued)

(52) U.S. Cl.
CPC .......... *G01R 29/085* (2013.01); *B64C 39/024* (2013.01); *G05D 1/0094* (2013.01);
(Continued)

(58) Field of Classification Search
USPC .......................................................... 701/11
See application file for complete search history.

(56) References Cited

U.S. PATENT DOCUMENTS 4,818,990 A   4/1989 Fernandes
5,575,438 A   11/1996 McGonigle et al.
(Continued)

FOREIGN PATENT DOCUMENTS

WO   WO 2008/048356 A2   4/2008

OTHER PUBLICATIONS

US 9,493,236 B2, 11/2016, Liu et al. (withdrawn)
(Continued)

*Primary Examiner* — Tyler D Paige
(74) *Attorney, Agent, or Firm* — Young Basile Hanlon & MacFarlane, P.C.

(57) ABSTRACT

Methods, systems and apparatus, for an unmanned aerial vehicle electromagnetic avoidance and utilization system. One of the methods includes obtaining a flight package indicating a flight pattern associated with inspecting a structure, the flight pattern causing the UAV to remain at a standoff distance from the structure, wherein the standoff distance is based on an electromagnetic field associated with the structure, and wherein the flight pattern is laterally constrained according to a property geofence associated with a right of way of the structure. The UAV is navigated according to the flight pattern, and the UAV captures images of the structure. For an initial portion of the flight pattern, the UAV navigates at an altitude based on the standoff distance and the property geofence towards the structure. The UAV determines a location at which to capture images of the structure, and the UAV provides the captured images to a user device.

33 Claims, 16 Drawing Sheets

(51) Int. Cl.
  *G08G 5/04* (2006.01)
  *B64C 39/02* (2006.01)
  *G08G 5/00* (2006.01)

(52) U.S. Cl.
  CPC ......... *G08G 5/0034* (2013.01); *G08G 5/0069* (2013.01); *G08G 5/045* (2013.01); *B64C 2201/123* (2013.01); *B64C 2201/141* (2013.01); *G08G 5/0086* (2013.01)

(56) References Cited

U.S. PATENT DOCUMENTS

| | | | |
|---|---|---|---|
| 5,581,250 A * | 12/1996 | Khvilivitzky | G01S 11/12 340/945 |
| 7,400,384 B1 | 7/2008 | Evans et al. | |
| 7,496,226 B2 | 2/2009 | Negandaripour et al. | |
| 7,872,794 B1 | 1/2011 | Minelly et al. | |
| 7,929,125 B2 | 4/2011 | Koehler et al. | |
| 8,060,270 B2 | 11/2011 | Vian et al. | |
| 8,207,484 B1 | 6/2012 | Williams | |
| 8,212,995 B2 | 7/2012 | Koehler et al. | |
| 8,346,578 B1 | 1/2013 | Hopkins et al. | |
| 8,818,572 B1 | 8/2014 | Tofte et al. | |
| 8,830,485 B2 | 9/2014 | Woloschyn | |
| 8,872,818 B2 | 10/2014 | Freeman et al. | |
| 8,874,283 B1 | 10/2014 | Cavote | |
| 8,896,819 B2 | 11/2014 | Schumann et al. | |
| 8,997,362 B2 | 4/2015 | Briggs et al. | |
| 9,009,000 B2 | 4/2015 | York et al. | |
| 9,129,355 B1 | 9/2015 | Harvey et al. | |
| 9,152,863 B1 | 10/2015 | Grant | |
| 9,162,753 B1 | 10/2015 | Panto et al. | |
| 9,256,225 B2 | 2/2016 | Downey et al. | |
| 9,256,994 B2 | 2/2016 | Downey et al. | |
| 9,273,981 B1 | 3/2016 | Downey et al. | |
| 9,310,221 B1 | 4/2016 | Downey et al. | |
| 9,311,760 B2 | 4/2016 | Downey et al. | |
| 9,329,599 B1 | 5/2016 | Sun et al. | |
| 9,340,283 B1 | 5/2016 | Downey et al. | |
| 9,403,593 B2 | 8/2016 | Downey et al. | |
| 9,406,237 B2 | 8/2016 | Downey et al. | |
| 9,505,494 B1 | 11/2016 | Marlow et al. | |
| 9,508,263 B1 * | 11/2016 | Teng | B64C 39/024 |
| 9,513,635 B1 | 12/2016 | Bethke et al. | |
| 9,607,522 B2 | 3/2017 | Downey et al. | |
| 9,609,288 B1 | 3/2017 | Richman et al. | |
| 9,613,538 B1 | 4/2017 | Poole et al. | |
| 9,618,940 B1 | 4/2017 | Michini et al. | |
| 2008/0059068 A1 | 3/2008 | Strelow et al. | |
| 2009/0265193 A1 | 10/2009 | Collins et al. | |
| 2010/0012776 A1 | 1/2010 | Hursig et al. | |
| 2010/0211302 A1 | 8/2010 | Ribbe et al. | |
| 2010/0215212 A1 | 8/2010 | Flakes | |
| 2010/0228418 A1 | 9/2010 | Whitlow et al. | |
| 2010/0268409 A1 | 10/2010 | Vian et al. | |
| 2010/0286859 A1 | 11/2010 | Feigh et al. | |
| 2010/0328499 A1 | 12/2010 | Sun | |
| 2011/0270470 A1 | 11/2011 | Svoboda et al. | |
| 2012/0016538 A1 * | 1/2012 | Waite | G01C 21/20 701/3 |
| 2012/0143482 A1 | 6/2012 | Goossen et al. | |
| 2012/0170797 A1 | 7/2012 | Pershing et al. | |
| 2012/0197461 A1 | 8/2012 | Barrows et al. | |
| 2012/0250010 A1 | 10/2012 | Hannay | |
| 2012/0262708 A1 | 10/2012 | Connolly | |
| 2012/0271461 A1 | 10/2012 | Spata | |
| 2013/0206915 A1 | 8/2013 | Desaulniers | |
| 2013/0216089 A1 | 8/2013 | Chen et al. | |
| 2013/0238168 A1 | 9/2013 | Reyes | |
| 2014/0018976 A1 | 1/2014 | Goossen et al. | |
| 2014/0061376 A1 | 3/2014 | Fisher et al. | |
| 2014/0168420 A1 | 6/2014 | Naderhirn et al. | |
| 2014/0259549 A1 | 9/2014 | Freeman et al. | |
| 2014/0267627 A1 | 9/2014 | Freeman et al. | |
| 2014/0277842 A1 | 9/2014 | Tofte et al. | |
| 2014/0316614 A1 | 10/2014 | Newman | |
| 2014/0316616 A1 | 10/2014 | Kugelmass | |
| 2014/0324405 A1 | 10/2014 | Plummer et al. | |
| 2014/0336928 A1 | 11/2014 | Scott | |
| 2015/0323930 A1 * | 11/2015 | Downey | G08G 5/006 701/2 |
| 2015/0343644 A1 | 12/2015 | Slawinsky et al. | |
| 2015/0344136 A1 | 12/2015 | Dahlstrom | |
| 2015/0377405 A1 | 12/2015 | Down et al. | |
| 2016/0004795 A1 | 1/2016 | Novak | |
| 2016/0068267 A1 | 3/2016 | Liu et al. | |
| 2016/0070265 A1 | 3/2016 | Liu et al. | |
| 2016/0176542 A1 | 6/2016 | Wilkins | |
| 2016/0187654 A1 | 6/2016 | Border et al. | |
| 2016/0209648 A1 | 7/2016 | Haddick et al. | |
| 2016/0225264 A1 | 8/2016 | Taveira | |
| 2016/0285774 A1 | 9/2016 | Downey et al. | |
| 2016/0307447 A1 | 10/2016 | Johnson et al. | |
| 2016/0313736 A1 | 10/2016 | Schultz et al. | |
| 2017/0192418 A1 * | 7/2017 | Bethke | G05D 1/0094 |
| 2017/0336806 A1 * | 11/2017 | Blanc-Paques | G08G 5/045 |
| 2017/0337824 A1 * | 11/2017 | Chen | G08G 5/0086 |
| 2018/0002010 A1 * | 1/2018 | Bauer | B64C 29/0025 |
| 2018/0032088 A1 * | 2/2018 | van Cruyningen | B64C 39/024 |
| 2018/0095478 A1 * | 4/2018 | van Cruyningen | G01S 17/89 |
| 2018/0096609 A1 * | 4/2018 | de la Cruz | G08G 5/0013 |
| 2018/0144644 A1 * | 5/2018 | Heinonen | G08G 5/0086 |
| 2018/0253980 A1 * | 9/2018 | Mohamadi | G08G 5/0052 |
| 2019/0033467 A1 * | 1/2019 | Moore | G01S 19/48 |

OTHER PUBLICATIONS

U.S. Appl. No. 15/068,272, filed Mar. 11, 2016, Bauer et al.
Airsight Australia web page, "Onesteel Wire Rope Plant", http://www.airsightaustralia.com.au/onesteel-wire-rope-plan/, Internet Archive Date Aug. 6, 2015, 3 pages.
Airsight Australia, "Case Study: Onesteel Wire Rope Plant—Mayfield NSW, Industrial roof inspections using unmanned aircraft systems (UAS)", Aug. 2014 (Google date: Sep. 1, 2014), 1 page, http://www.airrsightaustralia.com.au/wp-content/uploads/2014/08/Case-Study-Industrial-roof-inspections-Onesteel1.pdf.
Bonnin-Pascual et al., "Semi-autonomous visual inspection of vessels assisted by an unmanned micro aerial vehicle", 2012 IEEE/RSJ International Conference on Intelligent Robots and Systems, Oct. 7-12, 2012, Vilamoura, Algarve Portugal, pp. 3955.
Emmerson, Roy, "Bird's eye view", RICS Building Conservation Journal, Oct./Nov. 2015, p. 32.
Kendoul et al., "An adaptive vision-based autopilot for mini flying machines guidance, navigation and control", Autonomous Robots, vol. 27, Issue 3, Oct. 2009, pp. 165-188.
Merz, et al., "Beyond visual range obstacle avoidance and infrastructure inspection by autonomous helicopter", 2011 IEEE/RSJ International Conference on Intelligent Robots and Systems, Sep. 25-30, 2011, San Francisco, CA p. 4953.
Ouellette & Associates, "Drone use in claims adjusting", Jun. 1, 2015, 3 pages, http://www.indianaclaimsservice.com/drone-use-claims-adjusting/.
Russell, Lisa, "Up and away", The Construction Index (U.K.) Feb. 5, 2015, 14 pages, http://www.theconstructionindex.co.uk/news/view/up-and-away.

* cited by examiner

UNMANNED AERIAL VEHICLE ELECTROMAGNETIC AVOIDANCE AND UTILIZATION SYSTEM

CROSS-REFERENCE TO RELATED APPLICATIONS

Any and all applications for which a foreign or domestic priority claim is identified in the Application Data Sheet as filed with the present application are hereby incorporated by reference in their entirety under 37 CFR 1.57.

BACKGROUND

Electromagnetic fields can affect the operation of sensitive instruments that rely on a steady-state background electromagnetic field. For instance, a magnetometer included in a device (e.g., a compass) can normally point in a direction of magnetic north, which can be utilized to determine a true heading of a person, or a vehicle (e.g., an aircraft, a boat, and so on), carrying the device. However, when placed in an electromagnetic field, such as greater than a threshold magnetic field strength (e.g., measured in units of gauss or tesla), the compass can be affected such that it may no longer point towards magnetic north. For systems that rely on a reference point indicated by a background electromagnetic field (e.g., a magnetometer, a compass), an active electromagnetic field can interfere with proper operation of the system.

SUMMARY

Particular embodiments of the subject matter described in this specification can be implemented so as to realize one or more of the following advantages. Unmanned Aerial Vehicles (UAVs) can safely perform inspections of structures supporting overhead power lines (e.g., conductors), such as transmission towers, without electromagnetic fields radiating from the overhead power lines interfering with navigational abilities of the UAVs. A flight planning system can, with minimal user input, determine a flight plan for a UAV to implement, which can specify a standoff distance the UAV is to remain from the structure, while enabling the UAV to capture detailed sensor data or imagery of the structure using a determined flight pattern. The flight planning system can further determine a geofence for the UAV to enforce, which can be based on a right of way associated with the structure (e.g., land on which the structure is placed can be purchased, or an easement can be granted to a company, or governmental entity, that maintains the structure, and so on). Since the right of way can be a size (e.g., a width) that is fairly close to a boundary of the structure, a UAV may, without utilizing techniques described herein, have difficulty capturing imagery of the sides of the structure while remaining within the geofence at the standoff distance from the structure. As will be described, the flight planning system can determine flight patterns that enable proper imaging of the structure, such that a 3D model, a 3D point cloud, and so on, can be generated from the imagery captured by the UAV.

In this way, structures supporting overhead power lines can be quickly inspected (e.g., inspected for damage, such as by capturing images of a structure) while allowing human operators to be safely located away from the structure. Additionally, since the UAV can perform a determined flight plan (e.g., autonomously, or with minimal user input as will be described), an operator associated with the flight plan can have more limited training and expertise with respect to manually flying an aerial vehicle to perform inspections. That is, the flight planning system can democratize use of an UAV to perform inspections by reducing technical knowledge and skill necessary to perform the inspections.

Subject matter described in this specification can be embodied in a system, method or computer program product including the actions of navigating an unmanned aerial vehicle so that the vehicle stays within visual line of site of a ground operator.

In general, one innovative aspect of the subject matter described in this specification can be embodied in systems, computer readable media, and methods that include the actions of obtaining a flight package indicating a flight pattern associated with inspecting a structure, the flight pattern causing the UAV to remain at greater than a standoff distance from the structure, wherein the standoff distance is based on an electromagnetic field associated with the structure, and wherein the flight pattern is laterally constrained according to a property geofence associated with a right of way of the structure; navigating according to the flight pattern, and capturing a plurality of images of the structure, wherein for an initial portion of the flight pattern: navigating at an altitude based, at least in part, on the standoff distance and the property geofence towards the structure, and determining a location at which to capture one or more images of the structure based on location information associated with UAV and location information associated with the structure further indicated in the flight package; and providing, to a user device, the captured images for processing.

The details of one or more embodiments of the subject matter of this specification are set forth in the accompanying drawings and the description below. Other features, aspects, and advantages of the subject matter will become apparent from the description, the drawings, and from the claims.

DETAILED DESCRIPTION

A flight planning system (e.g., the flight planning system 100 described below), can generate flight plans for an unmanned aerial vehicle (UAV) to implement, enabling the UAV to perform jobs, such as performing inspections (e.g., inspections for damage) of structures (e.g., transmission towers, power lines, and so on). As will be described, the flight planning system, and/or a user device (e.g., the ground control system 150 describe below) of an operator optionally positioned proximate to a structure being inspected, can determine flight plans for a UAV to implement, with the flight plans enabling a safe inspection of a structure associated with an electromagnetic field. As an example, a transmission tower can support conductors carrying current at particular voltages, with the current generating magnetic fields (e.g., as represented by Ampere's Law, Biot-Savart Law) surrounding the conductors. As an overview, the generated magnetic field surrounding a conductor will increase with increasing current, and will be orthogonal to a direction of the current in the conductor. The magnetic field strength will also reduce according to the squared distance from the conductor (e.g., the strength falls off with respect to $r^2$).

As described above, an electromagnetic field can negatively affect a correct operation of sensors, systems, devices, and so on, that rely on a background electromagnetic field (e.g., electromagnetic field associated with the Earth). For instance, a UAV may rely on an electronic compass (e.g., a magnetometer) to determine a heading of the UAV with respect to north (e.g., magnetic north, true north). While navigating proximate to a transmission tower, an electromagnetic field associated with the transmission tower (e.g., generated by current through conductors) may negatively affect the electronic compass, such that the UAV will be unable to properly (e.g., correctly) determine its heading. Therefore, the UAV may be unable to properly navigate according to a flight pattern, which can cause unsafe operation of the UAV such that particular jobs (e.g., inspections of transmission towers) are unable to be performed.

Figure 7:
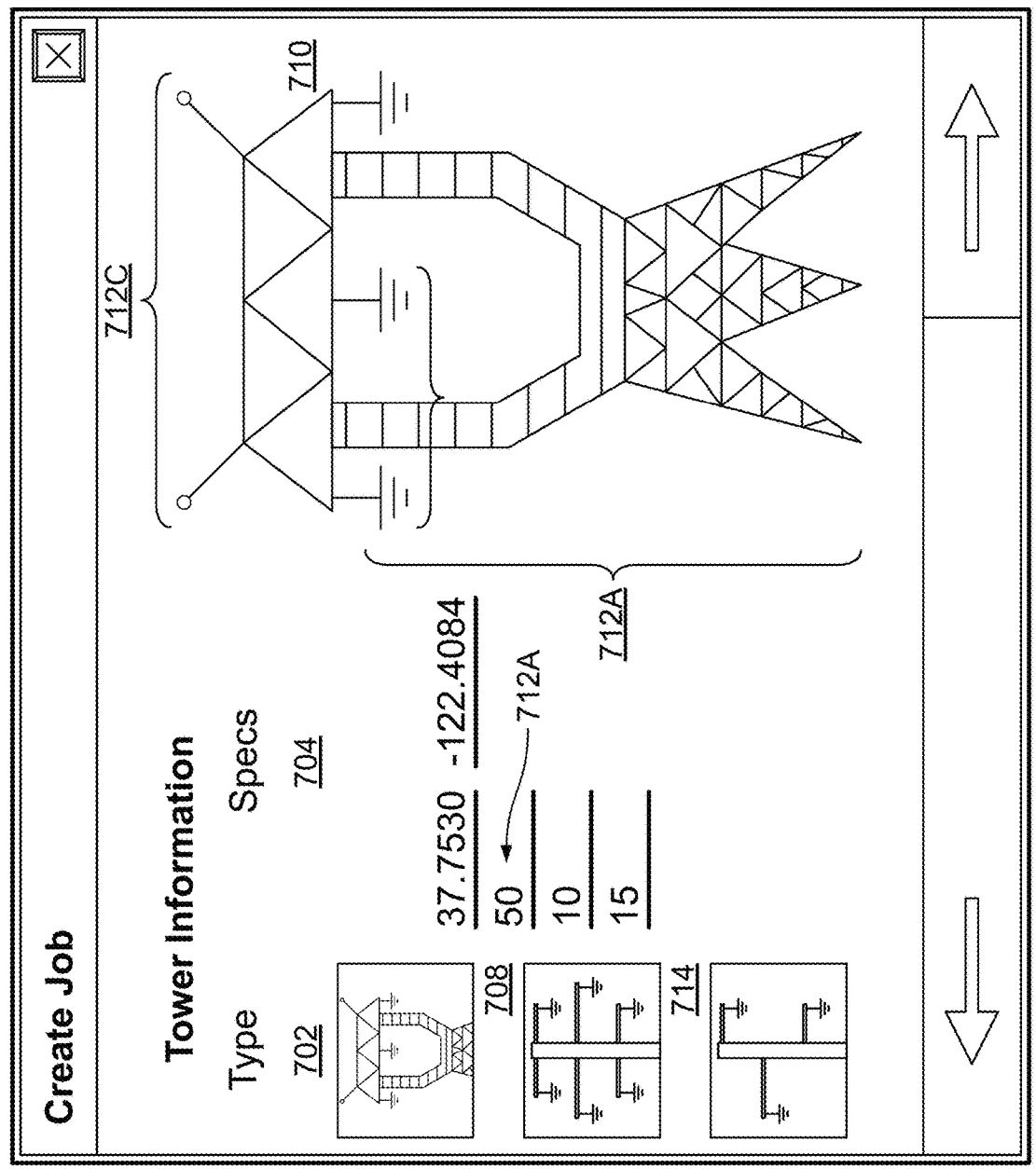
FIG. 7 illustrates an example user interface for describing physical information associated with a structure.

As will be described, the flight planning system can determine flight plans that enable the UAV to properly navigate while inspecting a transmission tower. To determine a flight plan, the flight planning system can receive, or obtain, information describing physical information of a structure to be inspected (e.g., herein also called a tower, or a transmission tower), for instance a height of the structure, a height of portions of the structure to be inspected (e.g., conductors, insulators, wires, attachments to the structure, and so on). For instance, transmission towers can be associated with particular types, such as a single-circuit transmission tower that carries three-phase power, a multi-circuit transmission tower including different arrangements of the circuits, and so on. An example user interface for specifying physical information is illustrated in FIG. 7. Additionally, the flight planning system can determine a distance, known herein as a standoff distance, from the structure at which a UAV inspecting the structure is to remain. In this specification, the standoff distance represents a distance at which an electromagnetic field associated with the structure does not negatively affect a safe or functional operation of a UAV (e.g., the UAV can correctly determine a heading). That is, the electromagnetic field associated with the structure can be less than a threshold strength at the standoff distance (e.g., as measured in gauss or tesla) such that the UAV can navigate according to a flight pattern (e.g., the electromagnetic field can be a threshold strength less than the Earth's electromagnetic field). As will be described, the flight planning system can utilize the physical information of the structure, and the standoff distance, to determine a flight pattern according to which the UAV is to navigate, enabling safe inspections of the structure.

Since, as described above, an electromagnetic field can increase according to a current being carried by conductors supported by the structure, the standoff distance can therefore depend on the current through the conductors. The flight planning system can access information identifying a maximum load (e.g., maximum power carried by the conductors, which is proportional to the current) and optionally a minimum load or an average load, and can determine the standoff distance according to the maximum load. Optionally, the minimum load or average load can be utilized to modify the maximum load, for instance the system can assume that if the minimum load is substantially lower, or the average load is lower, then the maximum load may be an unlikely worst-case scenario and can be lowered. Similarly, the flight planning system can determine a maximum load based on a time of day (e.g., a particular time of day, or particular day, may have greater or lesser load with respect to other times or other days), with the maximum load being determined from a measure of central tendency of a load for the time of day (e.g., an average), or a worst-case load (e.g., a highest measured load, or a load at one or more standard deviations from the mean). Optionally, the flight planning system can access live data (e.g., Green Button data, data from a utility company), and can determine a standoff distance using the live load data (e.g., the standoff distance can be determined at a start of a flight plan). Optionally, an operator positioned proximate to the inspection can utilize one or more sensors (e.g., a flux meter) to determine an electromagnetic field associated with the structure (e.g., the operator can utilize the flux muter, and information identifying a distance of the operator to the conductors, can determine an electromagnetic field strength). As will be described, a user device of the operator (e.g., ground control system 150) can update a flight plan generated by the flight planning system according to determined load information, or optionally the user device can generate the flight plan without the flight planning system 100.

As will be described, the flight planning system can generate a flight pattern the UAV is to navigate according to (e.g., the UAV is to follow), such that the UAV can remain at greater than the standoff distance from the structure (e.g., from the conductors supported by the structure). The flight pattern can be constrained according to right of way information associated with a structure (e.g., constrained laterally from moving outside a property boundary or easement associated with the structure).

Optionally, to ensure that the UAV does not navigate closer than the standoff distance, the flight planning system can generate a geofence according to the standoff distance, which in this specification is a virtual perimeter, or volume, for a real-world area, or volume, that limits allowable locations of the UAV. The geofence can describe a three-dimensional shape, such as a cylinder, based on one or more conductors supported by the structure, with a distance from the conductors to a boundary of the shape being based on the determined standoff distance. The UAV can store information describing the geofence (e.g., location information, such as GNSS coordinates sufficient to describe the shape), and can ensure that the UAV does not enter into the bounded shape. Optionally, the three-dimensional shape can precisely sketch a contour of the electromagnetic field. For instance, conductors between two structures (e.g., transmission towers) may sag according to a catenary curve, enabling the UAV to travel closer to the surface on which the structure is placed.

Similarly, to ensure that the UAV remains in a right of way associated with the structure (e.g., a property boundary, an easement, and so on), the flight planning system can generate a property geofence that limits allowable locations of the UAV to within the right of way. Since, as described above, the right of way can be narrow (e.g., the right of way can be a threshold size wider than the structure, which can be based on regulatory rules for an area at which the structure is located), to remain at the standoff distance from the structure the UAV may have to increase an altitude at which the UAV is to navigate (e.g., in contrast to increasing a lateral distance from the structure). Therefore, to capture images of the side of the structure, the UAV may have to capture shallow oblique images (e.g., the camera may be pointed 20, 25, 28, degrees from vertically downwards towards the structure), as the UAV navigates along the sides. Capturing images of the side of the structure is described below, with respect to at least FIG. 2F.

While the standoff distance can be determined as a singular distance at which a UAV is to remain from the structure, optionally the standoff distance can depend on a location of the UAV with respect to the structure. For instance, the standoff distance can represent an isotropic distance from which the UAV can be from any closest portion of the structure and be able to navigate properly. Optionally, the standoff distance can be anisotropic, and a function according to distance from the structure and location information of the structure and UAV. For instance, a transmission tower with 6 conductors (e.g., a multi-circuit transmission tower as illustrated in FIGS. 2A-2E), may have a complex electromagnetic field surrounding the structure, with particular lateral locations of the UAV experiencing a greater or lesser electromagnetic field at the same distance from the structure. Optionally, the flight planning system can determine a model describing the electromagnetic field (e.g., far-field electromagnetic field) associated with the structure, and can utilize the model to determine a standoff distance at any location along a flight pattern a UAV is implementing.

To perform the inspection of the structure, the flight planning system can determine a flight pattern that enables the UAV to obtain sensor information (e.g., digital images, ultra-violet sensor information, infrared sensor information, and so on) of the structure, while remaining at the standoff distance from the structure. Specifically, the flight pattern can enable the UAV to navigate towards the structure (e.g., in a direction of the conductors supported by the structure), capture sensor information of a bottom portion of the structure, and as the UAV navigates further, capture sensor information of correspondingly higher portions of the structure (e.g., oblique imagery, such as imagery captured at a same angle) until the UAV is over the structure, at which point the UAV can obtain sensor information of the top of the structure (e.g., nadir imagery). The UAV can then navigate beyond the structure along the conductors, and using one or more gimbals, can point the sensors in an opposite direction of navigation towards the structure to obtain sensor information of the top portion, to the bottom portion, as the UAV navigates further (e.g., oblique imagery, as imagery captured at the same angle). An example flight pattern is described below (e.g., with respect to FIG. 1), and illustrated in FIGS. 2A-2F.

Optionally, an initial flight plan can cause the UAV to obtain images from a greater distance than the standoff distance (e.g., one or more images of the entirety of the transmission tower). The obtained images can be utilized (e.g., by a photogrammetry system, by photogrammetry software executing on a user device, such as the ground control system 150) to generate a 3D point cloud. Subsequently, the above-described flight plan can obtain detailed images of the transmission tower, and the detailed images can be utilized in the 3D point cloud. For instance, a user viewing the 3D point cloud can select a particular portion of the transmission tower, and detailed images of the particular portion can be presented. Damage to any portion of the transmission tower can be identified, or otherwise labeled, on the 3D point cloud, such that a user can select the label and view detailed images.

Various types of UAVs may be used to implement the inventions described herein (for example, a fixed wing airplane, helicopter, a multi-rotor vehicle (e.g., a quad-copter in single propeller and coaxial configurations), a vertical take-off and landing vehicle, lighter than air aircraft). A multi-rotor vehicle in a coaxial configuration may use the same propeller pitch and diameter propellers, use different pitch and diameter propellers, or variable pitch propellers. In this specification, UAVs include drones, un-operated aerial vehicles, remotely operated aircraft, unmanned aircraft systems, any aircraft covered under Circular 328 AN/190 classified by the International Civil Aviation Organization, and so on. In addition, certain aspects of the disclosure can be utilized with other types of unmanned vehicles (e.g., wheeled, tracked, and/or water vehicles). Sensors, which are included in the general term payload (e.g., any hardware, software, module, and so on, that is not critical to the flight operation of the UAV), can include any device that captures real-world information, including cameras, radiation measuring instruments, distance detectors such as Lidar, and so on.

Figure 1:
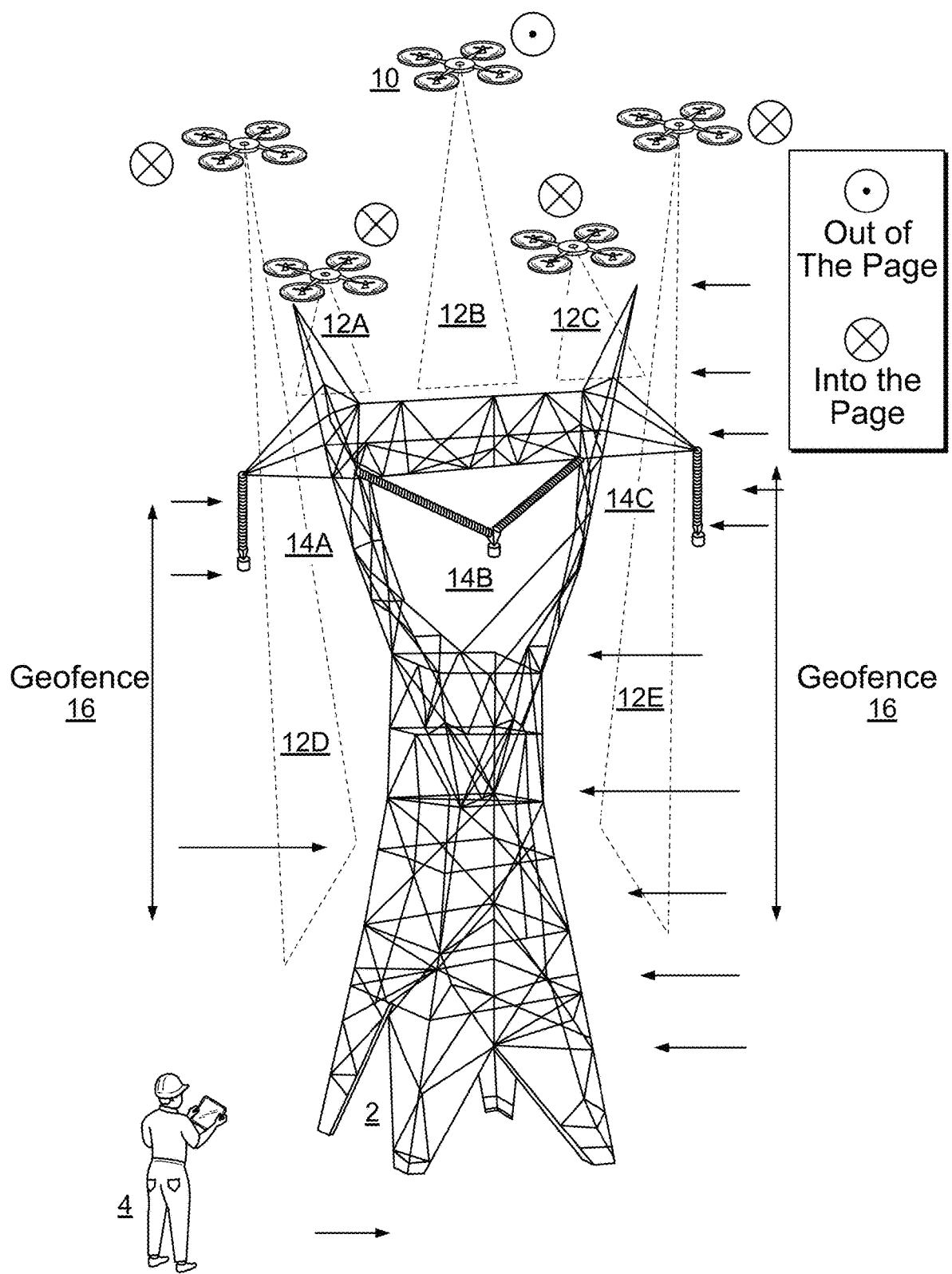
FIG. 1 illustrates an overview of an example transmission tower being inspected by an Unmanned Aerial Vehicle (UAV).

FIG. 1 illustrates an overview of an example transmission tower 2 being inspected by a UAV 12. As illustrated in the example, the transmission tower 2 is a single-circuit tower with three conductors associated with three phases of power. While FIG. 1 describes a three-phase power single circuit transmission tower 2, the techniques described in this specification can be utilized to perform inspections of multi-circuit transmission towers (e.g., a transmission tower with two circuits is described below, with respect to FIGS. 2A-2E).

FIG. 1 illustrates a representation of a flight pattern determined, for instance, by the flight planning system or a ground control system (e.g., in wired or wireless communication with the UAV 10) utilized by an operator 4 positioned proximate to the transmission tower 2. The flight pattern includes different portions (e.g., portions 12A-12E) that collectively enable the UAV 10 to capture images of the transmission tower 2. As will be described, the flight planning system can determine a number of portions to be included in a flight pattern based on one or more of a size (e.g., a width) of the transmission tower 2, a type of transmission tower (e.g., single circuit, multi-circuit, orientation of conductors that are associated with a same circuit), a ground sampling distance (e.g., a required level of detail to be included in captured images, such as a required pixels/meter or #pixels/meters$^2$), determined standoff distance, and information associated with a camera being utilized (e.g., focal length(s), aperture(s), sensor size and resolution, and so on). That is, the flight planning system can determine the flight pattern to ensure that images captured of the transmission tower 2 include images of the tower 2 (e.g., the entirety of the tower, or insulators, conductors, and so on 14A-14C) at the ground sampling distance (e.g., the images include the required level of detail, so that damage to the transmission tower can be determined).

The flight pattern includes a first portion 12A, in which the UAV 10 captures images while navigating along one of the conductors from a threshold distance behind the transmission tower 2 at an altitude based on a determined standoff distance, to a threshold distance in front of the transmission tower 2 at the altitude (e.g., in a direction out of the page as illustrated). As will be described, the UAV 10 can operate a gimbal that can maneuver a camera (e.g., modify attitude information of the camera) while the UAV 10 is navigating along the flight pattern, and during the first portion 12A, the gimbal can cause the camera to be pointed at a particular angle (e.g., 45 degree angle) with respect to a vertically downward direction (e.g., pointed towards the tower 2). Since the camera is to remain pointed at the transmission tower 2, the UAV 10 can cause the camera to point in a direction of travel when navigating towards the tower 2, and after reaching the tower, the UAV 10 can cause the camera to be pointed against a direction of travel when navigating beyond the tower 2 (e.g., the UAV 10 can therefore capture oblique imagery at a same angle). As will be described below, with respect to FIG. 2A, as the UAV 10 approaches the transmission tower 2, the UAV 10 can determine a location at which the transmission tower 2 enters a field of view of the UAV's 10 camera, and can capture images of the transmission tower 2 during the remainder of the first portion 12A. For example, the UAV 10 can capture images periodically (e.g., periodic in time, periodic in ground distance), and can optionally capture images upon determining that one or more portions of the transmission tower 2 have entered a field of view of the camera (e.g., the UAV 10 can identify insulators, conductors, attachments to tower 2, using computer vision techniques).

Upon reaching the threshold distance in front of the transmission tower 2 (e.g., a distance beyond which the transmission tower 2 is no longer in a field of view of the UAV's 10 camera while being pointed at the particular angle towards the tower 2), the UAV 10 executes a turn (e.g., towards portion 12B). The UAV 10 then navigates back towards the transmission tower 2 along the second portion 12B capturing images of the transmission tower 2 (e.g., oblique images captured at the same angle). For instance, the UAV 10 can capture detailed images of the conductor, insulator, attachments of the insulators/conductors/other elements to the transmission tower 2, and so on, 14A during the first portion 12A, and detailed images of the conductor, insulator, and so on, 14B during the second portion 12B. After reaching the threshold distance behind the transmission tower 2, the UAV 10 executes a turn, and navigates in an opposite direction along the third portion 12C capturing images. In this way, the UAV 10 can capture images of the transmission tower 2, while remaining at the standoff distance.

As described above, and as will be described below with respect to FIG. 2F, the UAV 10 can optionally capture images of the sides of the transmission tower 2 (e.g., lateral images). As illustrated in FIG. 1, the UAV 10 is constrained to a particular geofence 16 associated with a right of way of the transmission tower 2. Without the constraint, to capture images of a side of the transmission tower 2 (e.g., left side of the illustration), the UAV may otherwise be able to navigate laterally (e.g., to the left of the illustration), and capture images of the tower 2 by modifying an altitude and optionally gimbal orientation associated with the camera (e.g., the UAV 10 can ascend from a bottom portion of the tower 2, to a top portion of the tower 2 capturing images). However, with the constraint of the geofence 16, the UAV 10 is unable to navigate laterally, and therefore has to remain at the standoff distance from the transmission tower 2 within the geofence 16. Depending on the geofence 16 (e.g., a width of the right of way), the UAV 10 may have to remain at an altitude above the transmission tower 2 to be farther than the standoff distance from the tower 2 (e.g., as illustrated in FIG. 1, with respect to portions 12D-12E of the flight pattern).

Therefore, to obtain images of the sides of the transmission tower 2, the UAV 10 can cause the camera to be pointed at a particular angle (e.g., a shallow angle, such as 20, 25, 27, degrees) from a vertically downward direction towards the transmission tower 2. In this way the UAV 10 can navigate along the side of the transmission tower 2 capturing images of the tower 2. Optionally, the particular angle, and optionally in concert with a particular altitude of the UAV 10, can be based on a portion of transmission tower 2 being imaged. For instance, the UAV 10 can cause the camera to be pointed at the insulators, conductors, and so on, 14A and 14C as the UAV 10 navigates along the sides of the tower 2. Additionally, the UAV 10 can further maneuver the camera as it navigates to maintain the conductors, insulators, and so on, 14A and 14C in a field of view of the camera. That is, the camera can be rotated (e.g., rotated with respect to a yaw axis) to maintain the conductors, insulators, and so on, 14A and 14C in the field of view.

Figure 2A:
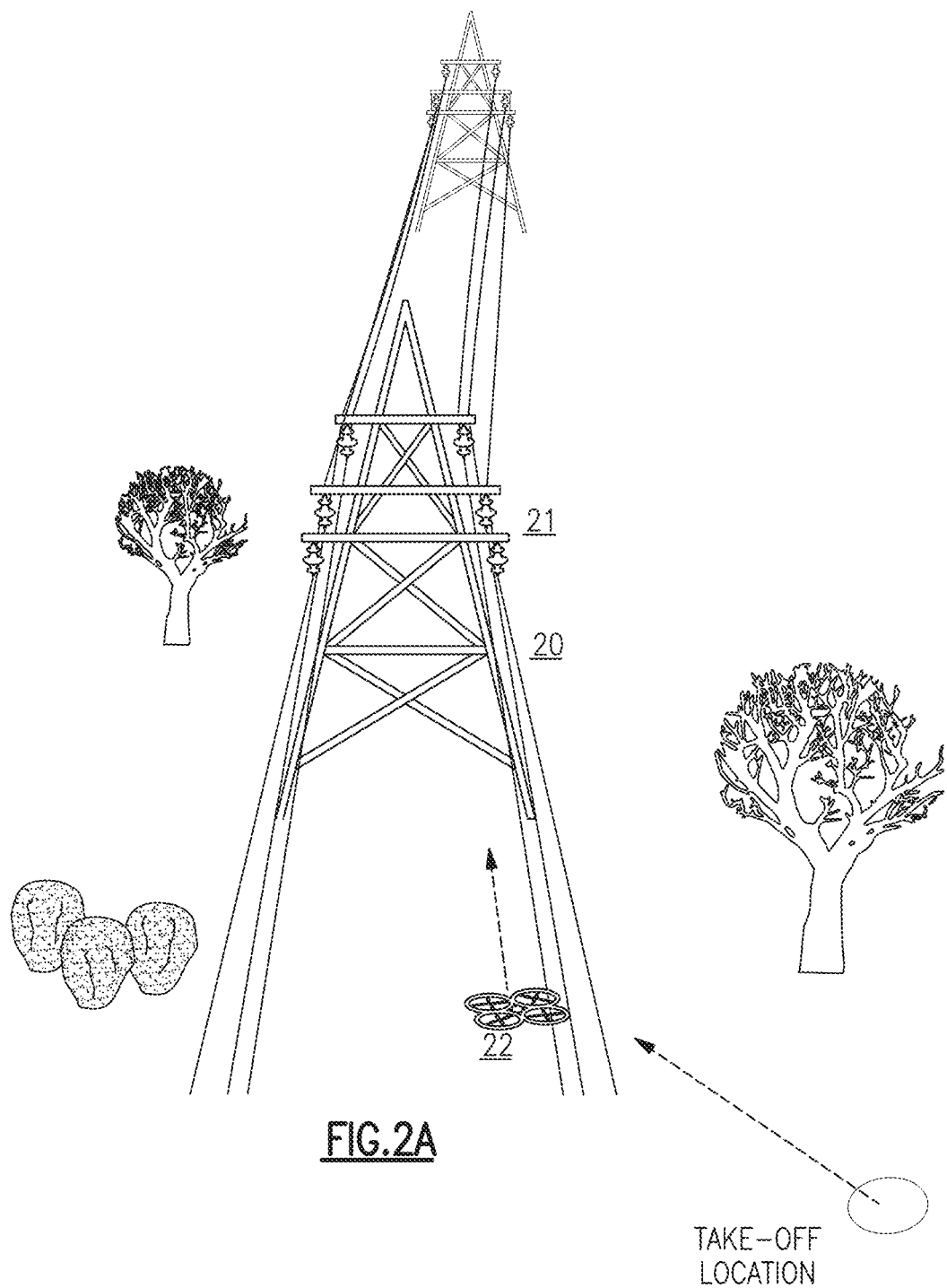
FIG. 2A illustrates a representation of UAV navigating towards a transmission tower.

FIG. 2A illustrates a representation of an Unmanned Aerial Vehicle (UAV) 22 navigating towards a transmission tower 20. As described above, the UAV 22 can perform an inspection of the transmission tower 20 by capturing images (e.g., periodically) of the transmission tower 20 according to a particular flight plan. As will be described, a flight planning system, or ground control system, can determine a flight plan that can vary based on physical information associated with a transmission tower (e.g., a type of the transmission tower, such as a single or multi-circuit tower, locations of particular portions, such as conductors, insulators, and so on), a measure of current through the conductors, and so on.

As illustrated in FIG. 2A, the transmission tower 20 includes two circuits (e.g., three conductors in a vertical line on each side of the tower 20, with each side being a distinct three-phase power circuit). The UAV 22 is navigating according to a determined flight plan, with the flight plan specifying that the UAV 22 is to initially perform an inspection of a first circuit 21, and then subsequently inspect a second circuit (e.g., illustrated in FIG. 2E). To perform the inspection of the first circuit 21, the UAV 22 ascends from a take-off location (e.g., a safe take-off location), which can be specified by a user (e.g., as described below, with respect to FIG. 6), and navigates along the conductors associated with the first circuit 21 at an altitude specified by a standoff distance (e.g., determined based on the measure of current). Optionally, and as will be described in FIG. 2F, the UAV 22 can capture images of a side of the transmission tower 20 (e.g., the right side of the figure) prior to inspecting the first circuit 21.

Figure 2B:
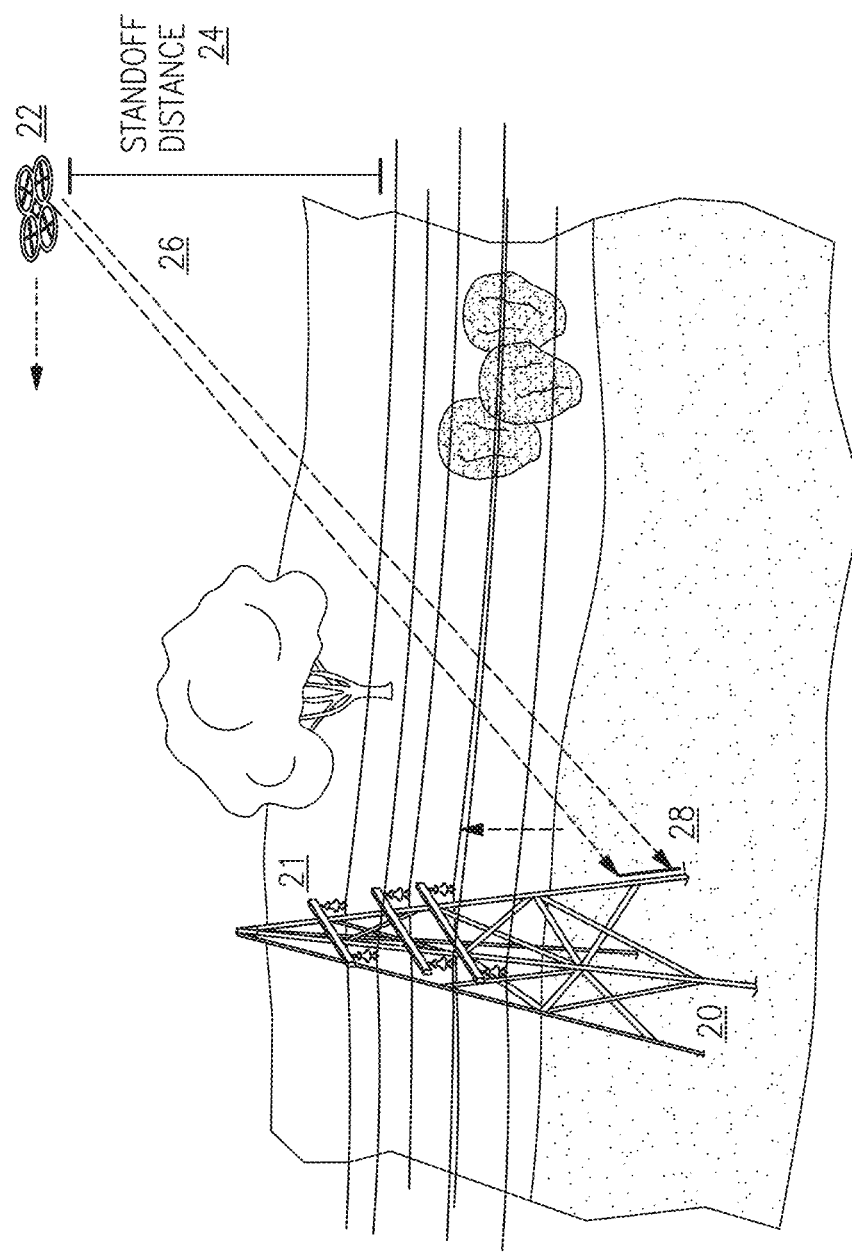
FIG. 2B illustrates a side-view representation of the UAV capturing images of the transmission tower.

FIG. 2B illustrates a side-view representation of the UAV 22 capturing images of the transmission tower 20. As illustrated, the UAV 22 is navigating towards the transmission tower 20 along conductors associated with the first circuit 21, while remaining at the standoff distance 24 above the conductors.

The UAV 22 navigates along the conductors until the transmission tower 20 enters a field of view of a camera of the UAV 22. As described above, the UAV 22 manipulates a gimbal that controls an attitude of the camera, to cause the camera to point at a particular angle from a direction vertically down (e.g., 40, 45, 50 degrees) towards the transmission tower 20. As will be described in more detail, the flight plan provided to the UAV 22 (e.g., by the ground control system 150 as will be described below, such as using example user interface 700 illustrated in FIG. 7), can specify physical information associated with the transmission tower 20, which the UAV 22 can utilize to determine a location at which to begin capturing images of the transmission tower 20. For instance, the physical information can include location information of the tower 20, such as coordinates (e.g., longitude/latitude, GNSS coordinates) of a centroid of the tower 20 along with a radius indicating a size of the tower (e.g., the radius can indicate an oval that can surround a footprint of the tower 20). Location information can further include a height of the tower 20, locations and heights of particular portions to be imaged (e.g., insulators, attachments of the conductors or insulators to the tower 20, and so on).

The UAV 22 can obtain location information specifying its present location using a GNSS receiver (using a GPS, GLONASS, Galileo, or Beidou receiver) while navigating along the conductors, and utilize the obtained location information to determine whether a field of view of the camera includes the transmission tower 20. The field of view of the camera can be determined according to characteristics of the camera, such as a focal length of a lens of the camera (e.g., an effective focal length) and an orientation in space of the camera (e.g., attitude information of the camera, as maneuvered by the gimbal, along with attitude information of the UAV 22, as determined by an inertial measurement unit (IMU)). The UAV 22 can optionally determine a projection of the camera's field of view on the real-world and determine a location (e.g., GNSS coordinates), at which the field of view will include the transmission tower 20. In this way, the UAV 22 can trigger capture of an image at a location at which the transmission tower 20 becomes visible. Since GNSS receivers are generally accurate to within a threshold precision, the UAV 22 can determine to capture an initial image prior to a threshold distance prior to a location at which the transmission tower 20 enters the camera's field of view (e.g., the GNSS receiver may not provide accurate location information sufficient to ensure that the field of view presently includes the transmission tower 20). In this way, the UAV 22 can ensure that, even with GNSS errors, an image is captured of a lowest portion of the transmission tower 20. Optionally, the UAV 22 can place the camera in a live-view mode, and analyze obtained images (e.g., the obtained images can be reduced resolution to conserve processing time and battery) to determine whether the transmission tower 22 is visible. That is, the UAV 22 can perform feature recognition and determine a location at which a surface (e.g., a dirt ground, a paved roadway, and so on) gives way to the rising of the transmission tower 20, or a location at which insulators, attachments to the tower 20, become visible.

As illustrated in the example representation, the UAV 22 has determined that a field of view 26 of the UAV's 22 camera includes the transmission tower 20, which in the example of FIG. 2B is the lowest portion 28 of the transmission tower 20 (e.g., located at the surface on which the tower 20 is located). Alternatively, for some flight plans, an initial view of a transmission tower can be insulators, attachments, located at a particular height above the surface on which the transmission tower 20 is located. For instance, as illustrated in FIG. 1 the initial portion 12A of a flight plan is associated with inspecting a particular conductor (e.g., the left conductor as illustrated in FIG. 1). When performing an inspection of the particular conductor, a UAV may begin capturing images of the transmission tower along the initial portion 12A when the insulators, attachments, and so on, 14A enter a field of view of a camera of the UAV. That is, the field of view of the camera may not include any of the transmission tower 2 until the insulators, attachments, and so on, 14A enter the field of view. For the subsequent portion 12B, the UAV may begin capturing images when a lowest portion of the transmission tower 2 enters the field of view.

The UAV 22 navigates along the conductors capturing images of the transmission tower 20, and as the UAV 22 navigates closer to the transmission tower 20, the field of view 26 of the camera ascends up the transmission tower 20. In this way, the UAV 22 can capture images of the first circuit 21 in a single pass (e.g., insulators associated with each conductor in the first circuit 21, attachments of the insulators and/or connectors to the tower 20, and so on). That is, since, as described above, the conductors associated with the first circuit 21 are arranged vertically, the ascending images will include images of each insulator, attachment, and so on, associated with each conductor. The images can therefore be oblique images of the transmission tower 20, with each image being captured at a same angle of the UAV 22 to the transmission tower 20.

However, for some transmission towers, the conductors might not be in a substantially vertically line, and one or more of the conductors associated with the first circuit 21 may be spaced a threshold horizontal distance from other circuits above or below it (e.g., an example is illustrated in FIG. 7 with respect to transmission tower 714). For example, a transmission tower may have three conductors associated with a first circuit located in a substantially vertical line. A top and bottom conductor may be located a same, or similar, distance from a center of the transmission tower, while a middle conductor may be located a threshold distance further from the center (e.g., transmission tower 714). Therefore, a UAV capturing images of the example transmission tower may capture images of the bottom conductor, and as the UAV moves closer to the transmission tower, capture images of the top conductor, but miss images of the middle conductor. For example, this can occur if a field of view of the camera is small (e.g., focused) due to a high ground sampling distance (e.g., a high level of detail, such that each image includes highly detailed zoomed-in portions of the example transmission tower). Therefore, the middle conductor may be located horizontally too far from the bottom conductor, such that as the UAV's field of view vertically ascends, the middle conductor is not included in the field of view. To ensure that the middle conductor is included in images, the UAV can optionally capture images of the bottom conductor, and upon reaching a particular distance from the transmission tower, orient a gimbal such that the camera is rotated (e.g., rotated about a yaw axis) horizontally to include images of insulators, attachments, and so on, associated with the middle conductor. Subsequently, the UAV can modify the gimbal such that the camera is rotated back to a prior position, to capture images of the top conductor (e.g., insulators, attachments, and so on). Alternatively, the UAV can temporarily move horizontally while capturing images of the middle conductor, and then move back horizontally when capturing images of the top conductor. The flight plan (e.g., generated by the flight planning system 100, or ground control system 150, as will be described) can optionally specify that the UAV is to navigate along an initial portion of the flight plan associated with capturing images of middle conductor, and subsequently navigate along an adjacent portion of the flight plan associated with capturing images of the bottom and top conductors. That is, the initial portion can be performed along a particular direction, and the subsequent portion can be performed along an opposite direction (e.g., as described above, with respect to FIG. 1).

Similarly, as illustrated in FIG. 2B, the UAV 22 is capturing images of a lowest portion 28 of the transmission tower 20, up to a top of the transmission tower 20 along the first side 21 (e.g., the first circuit). As described above, the ground sampling distance can be specified such that a field of view of the camera will include highly detailed images, and therefore may not include the first circuit 21 as the camera's field of view 26 ascends from the lowest portion 28. That is, the conductors, insulators, attachments, associated with the first circuit 21 may be located horizontally from the structure, such they may not be included in images captured by the UAV 22. To ensure that images associated with the first circuit 21 are captured, the UAV can, as described above, modify an orientation of a gimbal, a horizontal location, or the flight plan can optionally specify that the first circuit 21 is to be imaged initially, followed by the lowest portion 28 of the transmission tower 20 upwards (e.g., as illustrated in FIG. 1). In the described scenario in which the UAV 22 performs an inspection of the first circuit 21, the UAV 22 can determine a location at which insulators, attachments, and so on, associated with the first circuit 21 enter a field of view 26 of the camera, and begin capturing images (e.g., as described above).

As described above, the camera of the UAV 22 points at a particular angle (e.g., 40, 45, 50 degrees) from a direction vertically downwards towards the transmission tower 20. The particular angle can be a constant (e.g., 40, 45, 50, degrees), and optionally the particular angle can be determined with respect to the following.

As the UAV 22 navigates closer to the transmission tower 20, a distance from the UAV 22 to the transmission tower 20 necessarily decreases. If the UAV 22 is utilizing a camera with a fixed focal length, the field of view of the transmission tower 20 (e.g., a real-world area included in each image) will also decrease, as the lens will be effectively zooming in on the transmission tower 20. To ensure that the entirety of the transmission tower 20 is imaged (e.g., as illustrated, a lowest portion 28 to a top portion are to be imaged), the particular angle at which the camera is to be pointed at can be set such that a location at which the UAV 22 images a top of the transmission tower 20 is a threshold distance from the transmission tower 20. The threshold distance can be set such that, for the focal length of the camera, the field of view of the camera will not be too zoomed in, such that it will not miss portions of the top of transmission tower 20. For instance, as an example, if the particular angle were set at 5 degrees, the UAV would begin capturing images of the transmission tower at a substantially closer distance to the transmission tower (e.g., in contrast to the particular angle being 45 degrees). When the UAV images the top of the transmission tower 20, the UAV will be substantially closer to the transmission tower, such that the camera will not include a large enough area of the tower 20 (e.g., images of the top of the transmission tower obtained according to the described flight plan in FIGS. 2A-2F will not capture all of the top).

Similarly, as the UAV navigates closer to the transmission tower 20, and the field of view decreases, a perceived speed at which the field of view is moving up the tower 20 will increase. That is, at the lowest portion 28 of the transmission tower 20, the field of view will be a greater real-world area, such that the camera can have more time (e.g., for a constant velocity of the UAV 22) to capture a subsequent image without missing a portion of the tower 20. When the UAV is imaging closer to the top portion of the transmission tower 20, the field of view will be of a smaller real-world area, such that to capture subsequent images of the transmission tower 20 without missing any of the tower 20, the camera will have to capture images at a greater periodic rate. The flight planning system 100, or ground control system 150, can ensure that a camera with a minimum frame rate is selected. As described above, if the particular angle at which the camera is pointed at is reduced (e.g., 5 degrees as described above), the field of view of the camera will also be a smaller real-world area (e.g., in comparison to 45 degrees). Near the top of the tower 20, the camera may be unable to keep pace with a periodic time at which to capture images. Additionally, the camera may have to increase a shutter speed when capturing images near the top of the transmission tower 20. An availability of light may force the camera to increase an ISO, or lower an f-stop (e.g., increase aperture size reducing a depth of field, and increasing distortion in the lens), such that images are noisier or lack detail. Optionally, the flight plan can specify that the UAV reduce its velocity along the flight pattern (e.g., from the lowest portion to the top portion of the transmission tower 20), such that the UAV can capture sufficient images given the frame rate of the camera (e.g., camera information can be utilized).

Therefore, the flight planning system 100 or ground control system 150 can select the particular angle (e.g., 45 degrees) to ensure that a camera can (1) properly capture images that include sufficient area of the tower 20 and (2) can capture images fast enough to keep pace with the movement of the field of view. The selection can further be based on a ground sampling distance indicated by a user, as with a fixed length lens, the ground sampling distance will need to be met at the lowest portion 28 of the transmission tower 20. For an available fixed length lens (e.g., the flight planning system 100 can maintain availabilities of UAVs, lenses, cameras, and so on, for jobs associated with particular times), and an altitude of the UAV 22 based on the standoff distance 26, the flight planning system 100 or ground control system 150 can determine the particular angle to provide (1) the ground sampling distance in images when the UAV 22 is farthest, such as images of the lowest portion 28, and (2) ensure images include sufficient area and the camera can keep pace with capturing images.

Optionally, instead of a fixed-length lens, the UAV 22 can utilize a variable length lens with a range of focal lengths available for selection. As the UAV 22 navigates towards the transmission tower 20, the UAV 22 can adjust the focal length to be lower (e.g., lower a zoom). Through adjustments made to the lens, the UAV 22 can ensure that a field of view of the camera remains substantially similar (e.g., includes a similar real-world area). Additionally, the UAV 22 can maintain a consistent ground sampling distance from the bottom portion 28 of the transmission tower 20 to the top portion. That is, as described above the ground sampling distance will have to be satisfied for images of the bottom portion 28. By reducing a focal length of a lens, the ground sampling distance can be maintained as the field of view 26 of the camera ascends upwards (e.g., as the UAV 22 navigates towards the transmission tower 20).

Optionally, instead of the UAV 22 capturing images of the transmission tower 20 from a bottom portion to a top portion as the UAV 22 navigates closer, the UAV 22 can initially capture images of the top portion and successive images can be captured lower. For instance, the camera of the UAV 22 can point in a substantially horizontal direction, and as the UAV 22 navigates closer to the tower 20, the camera can be modified to point at angles closer to vertically downwards. In this way, the UAV 22 can capture images from top to bottom, and when the UAV 22 navigates over the tower 22, the camera will already be pointing downwards to capture images (e.g., nadir images) of the top of the tower (e.g., as described below with respect to FIG. 2C).

The UAV 22 navigates until reaching within a threshold distance of the top of the transmission tower 20. The UAV 22 then modifies a direction of the camera to be pointing substantially downwards (e.g., nadir images).

Figure 2C:
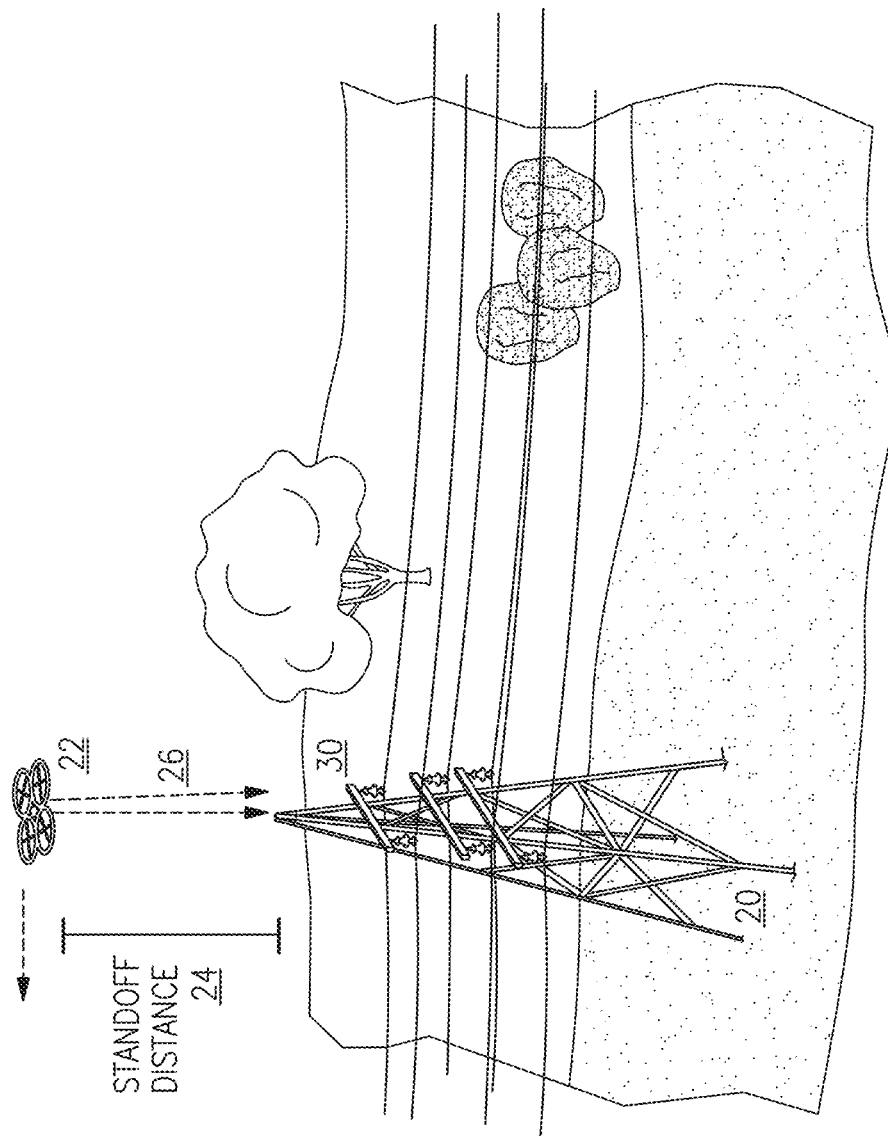
FIG. 2C illustrates a representation of the UAV capturing images of a top of the transmission tower.

FIG. 2C illustrates a representation of the UAV 22 capturing images of a top 30 of the transmission tower 20. As described above, the UAV 22 will capture images (e.g., oblique images) of the top of the transmission tower 20 a threshold distance from the transmission tower 20 (e.g., based on the particular angle the camera is pointing). The UAV 22 can then modify a position of the camera to point downwards (e.g., modify an orientation of the gimbal). The UAV 22 can determine a location at which the field of view 26 includes a top of the transmission tower 20, and can capture images while navigating (e.g., beyond the structure, which is illustrated in FIG. 2D).

Optionally, the UAV 22 can maneuver the camera to remain pointed at a particular portion of the top of the transmission tower 20 (e.g., the UAV 22 can modify a pitch axis of the gimbal). For instance, the UAV 22 can utilize location information associated with particular portions of the transmission tower 20, and maintain a field of view of the camera on a portion. As an example, the UAV 22 can capture images of a ground wire (e.g., also called a guard wire) that are placed on top of the transmission tower 20. The UAV can obtain images of the ground wire (e.g., an attachment of the ground wire to the tower 20) as the UAV navigates beyond the tower 20. The UAV can utilize the location information (e.g., height of the ground wire, location of the attachment, and so on), along with a location of the UAV (e.g., GNSS coordinates), to determine a particular vector to point the camera. The UAV can modify the vector according to its flight pattern over the transmission tower 20.

Figure 2D:
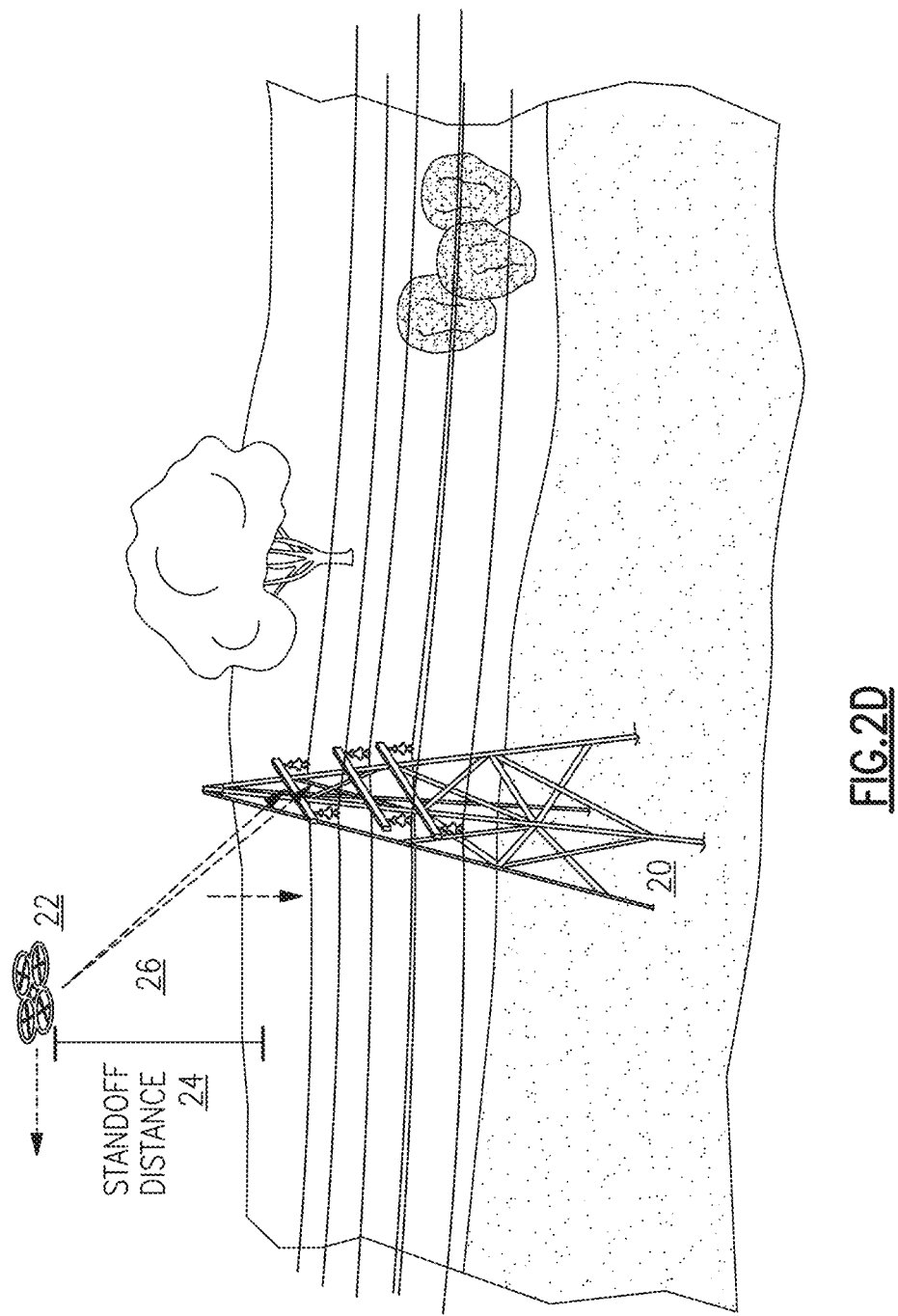
FIG. 2D illustrates a side-view representation of the UAV capturing descending images of the transmission tower.

FIG. 2D illustrates a side-view representation of the UAV 22 capturing descending images of the transmission tower 20. As the UAV 22 navigates beyond the top of the transmission tower 20, such that images captured with the camera pointing substantially down (e.g., nadir images) no longer include the transmission tower 20, the UAV modifies an orientation of the gimbal to point at the particular angle (e.g., described above, with respect to FIG. 2B) towards the transmission tower 20. The UAV 22 then navigates along the conductors capturing images of the other side (e.g., with respect to FIG. 2B) of the transmission tower, until imaging the bottom portion 28 of the tower 20 (e.g., the back-side of the bottom portion 28).

As described above, for particular transmission towers the UAV may not obtain descending images of the tower until the bottom of the tower is reached. Rather, the UAV may obtain images of a particular portion of the tower (e.g., insulators, attachments, and so on). As the UAV captures images of the particular portion while navigating beyond the transmission tower, the UAV can modify an orientation of the gimbal to cause the camera to track the particular portion while the UAV navigates. That is, the UAV can obtain images of the particular portion at varying angles, and varying distances from the transmission tower.

Figure 2E:
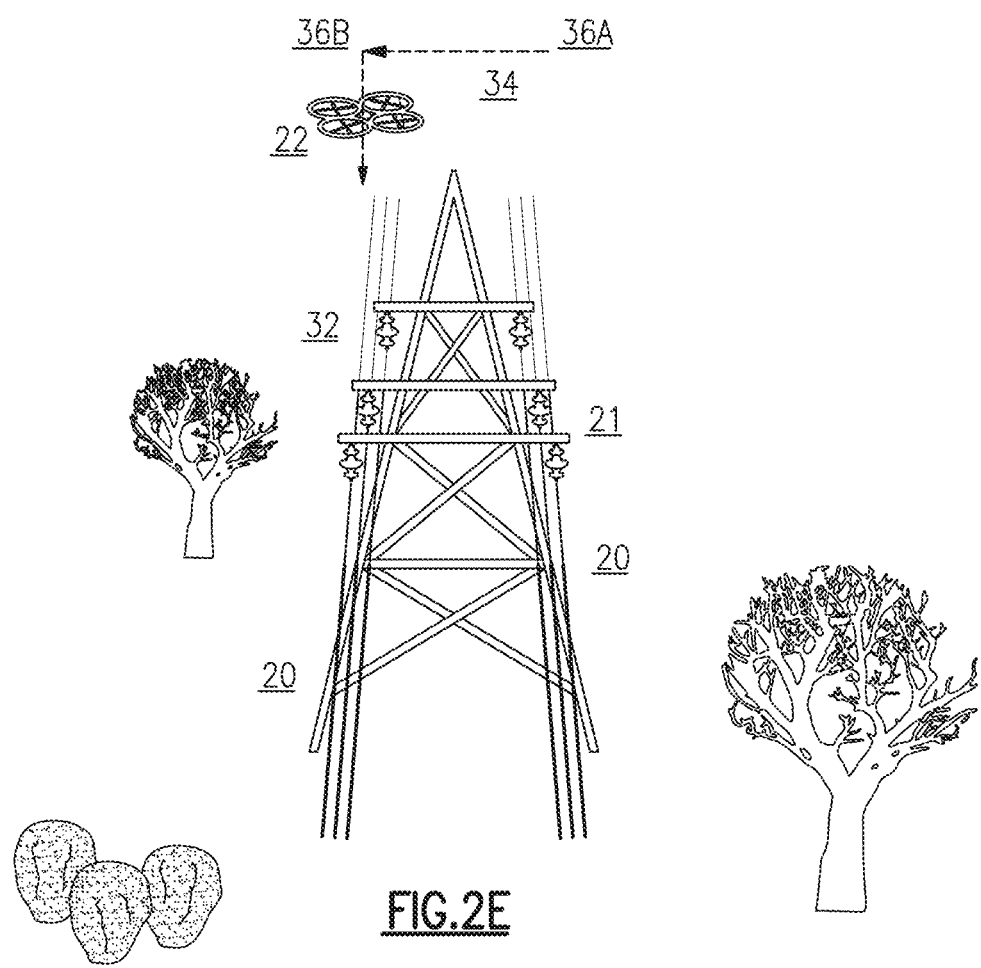
FIG. 2E illustrates a representation of the UAV executing a turn, and navigating along conductors associated with a second circuit of the transmission tower.

After obtaining images of the transmission tower 20, as described in FIG. 2D, the UAV 22 performs an inspection of a second side 32 of the transmission tower 20 (e.g., a second circuit). FIG. 2E illustrates a representation of the UAV 22 executing a turn, and navigating along conductors associated with the second circuit 32. Upon reaching a threshold distance from the transmission tower along conductors associated with the first circuit (e.g., a distance at which the transmission tower 20 is no longer included in a field of view of the camera), the UAV 22 executes a turn 34 (e.g., a left turn in the illustrated example), to navigate towards the conductors associated with the second circuit.

While executing the turn 34, the UAV 22 can capture images of the transmission tower 20. For instance, the UAV 22 can navigate above the transmission tower 20 (e.g., according to the standoff distance), and modify the particular angle at which the camera is pointing to capture images of the transmission tower 20 while executing the turn 34. As an example, the UAV 22 can move along the direction of the turn 34, and periodically capture images of the transmission tower 20 while moving. Optionally, the UAV 22 can hover while at location 36A, and maneuver the camera (e.g., rotate a yaw axis of the gimbal) to point at a far side of the transmission tower 20 (e.g., in a direction away from the direction of the turn 34) and periodically capture images while maneuvering the camera to point at the opposite side of the transmission tower 20. The UAV 22 can maneuver along the turn 34, and hover at a point in between 36A and a final location of the turn 36B. The UAV 22 can then maneuver the camera to point at the first side of the transmission tower 20 (e.g., towards location 36A), and periodically capture images while maneuvering the camera to point at location 36B. The UAV 22 can repeat the maneuvering while at location 36B. In this way, the UAV 22 can capture images of the transmission tower 20 (e.g., perform a scan of the tower 20 by maneuvering the camera) at various locations along the turn 34.

Upon reaching location 36B, the UAV 22 navigates along the conductors associated with the second circuit 32, and captures images of the transmission tower 20 (e.g., as described above with respect to FIG. 2B. For example, the UAV 22 navigates in an opposite direction along the second circuit 32.

As described above, while the transmission tower illustrated in FIGS. 2A-2E included two circuits, with three conductors vertically arranged for each circuit, other transmission towers may be oriented differently. For instance, the transmission tower illustrated in FIG. 1 includes one circuit, with three conductors spaced horizontally apart. As described in FIG. 1, a UAV can perform a flight plan to navigate along each conductor, transitioning to adjacent conductors by executing turns. The techniques described in FIGS. 2A-2E apply to other types of transmission towers, for instance the transmission tower illustrated in FIG. 1.

Figure 2F:
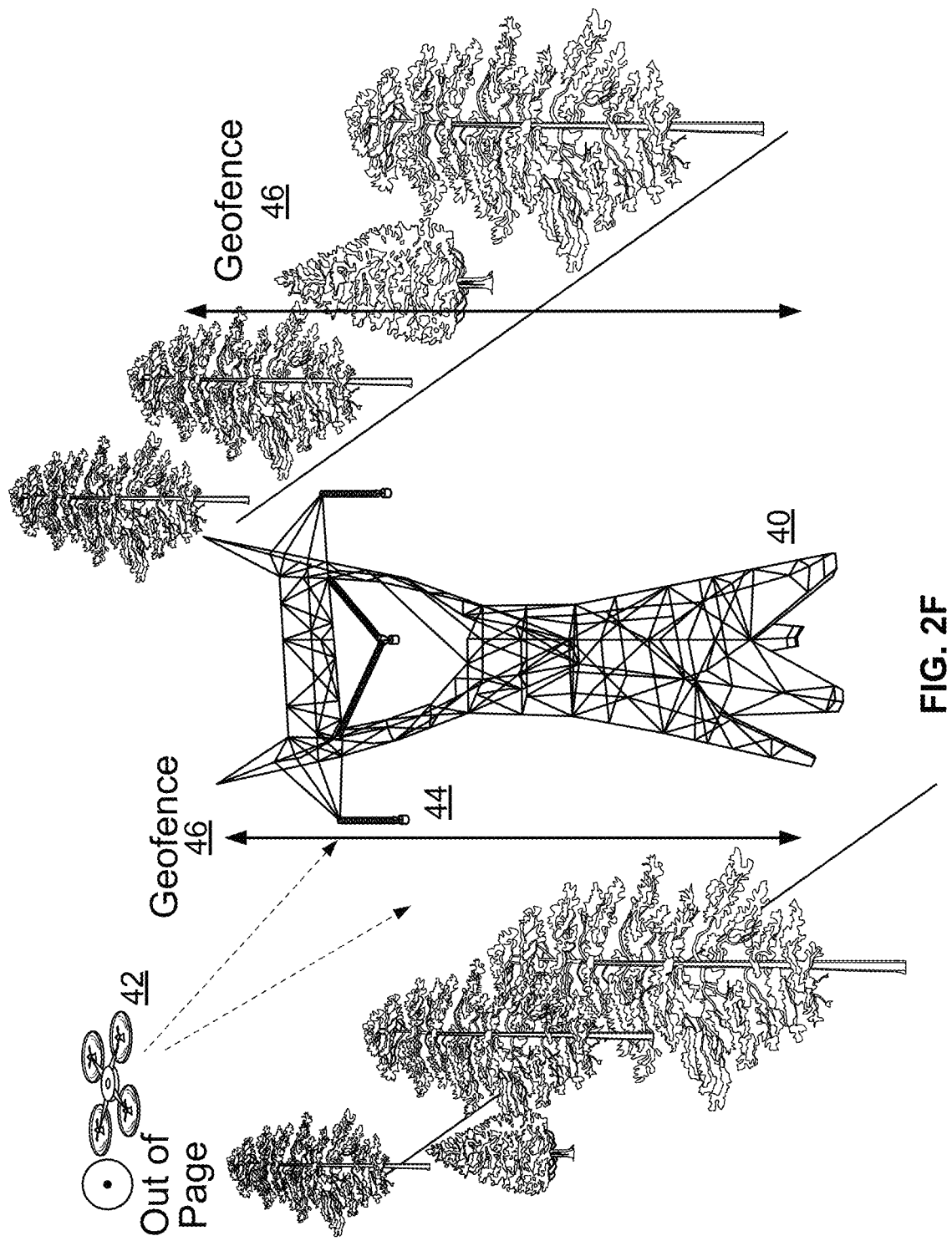
FIG. 2F illustrates a representation of a UAV navigating along a side of a transmission tower capturing images.

FIG. 2F illustrates a representation of a UAV 42 navigating along a side of a transmission tower 40 capturing images. As described above, with respect to FIG. 2A, the flight plan can optionally indicate that the UAV 42 is to ascend from a take-off location, and capture images of a side of a transmission tower prior to navigating along the conductors of the transmission tower (e.g., as described above, with respect to FIG. 2B).

As illustrated in FIG. 2F, the UAV 42 is navigating (e.g., in a direction out of the page) along a side of the transmission tower 40 at an altitude based on the standoff distance determined for the transmission tower 40, while constrained in a lateral direction by a determined geofence 46. A camera of the UAV 42 is pointed at a particular angle (e.g., 20, 25, 30, degrees) from a direction vertically downwards at the transmission tower 40. As the UAV 42 navigates (e.g., in a direction out of the page), the UAV 42 captures images of the side of the transmission tower 40 (e.g., at the particular angle). The UAV 42 captures images until reaching a threshold distance away from the transmission tower 40, with the threshold distance being a same distance as described in FIG. 2E. That is, the UAV 42 navigates until reaching the threshold distance, at which point the UAV 42 executes a turn, and navigates back towards the transmission tower 40 (e.g., into the page) along an initial conductor capturing images (e.g., as described above, with respect to FIG. 2B).

Optionally, the UAV 42 modify an orientation of the camera as the UAV 42 navigates along the side. For instance, the UAV 42 can determine a location at which a field of view of the camera no longer includes the transmission tower 40, and can cause the camera to rotate (e.g., rotate about one or axes) back towards the transmission tower 40 to capture images of the transmission tower. For example, the UAV 42 can track a portion of the tower during navigation, such as one or more insulators, attachment(s), and so on.

In the example of FIG. 2F, the transmission tower 40 includes an initial conductor 44, and associated insulators, attachments to the transmission tower 40. As the UAV 42 navigates along the side of the transmission tower 40, the UAV 42 can maneuver the camera to remain pointed at the initial conductor 44 (e.g., insulator, attachment), such that the UAV 42 can capture images of the initial conductor 44 from multiple angles.

Optionally, the UAV 42 can periodically hover at locations while navigating along the side of the transmission tower 40, and capture images from a direction vertically down, to the far side of the transmission tower 40 (e.g., the UAV 42 can rotate the gimbal about the roll axis to increase the particular angle, and capture images of the transmission tower 40 at discrete angles). In this way, the UAV 42 can capture images of the transmission tower (e.g., top of the transmission tower 40) from multiple locations while navigating along the side of the transmission tower 40.

Figure 3A:
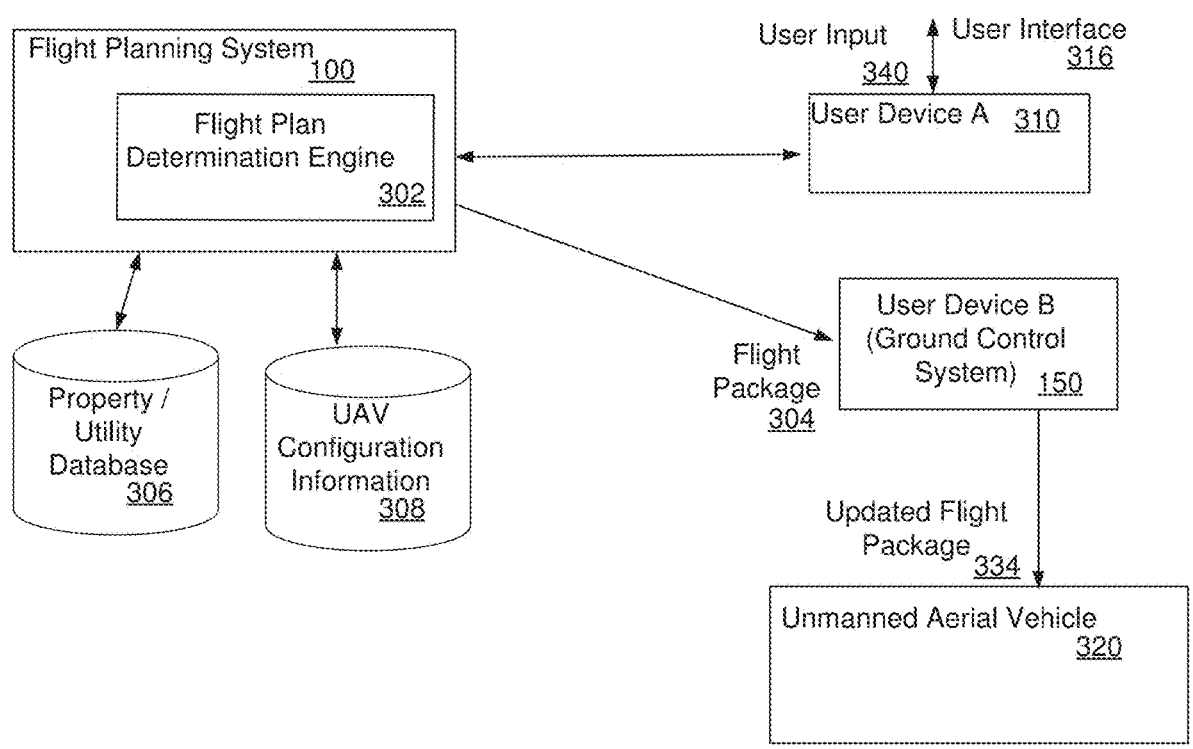
FIG. 3A illustrates a block diagram of an example flight planning system.

FIG. 3A illustrates a block diagram of an example flight planning system 100. The various illustrated components (e.g., systems and elements illustrated in FIG. 3A) may communicate over wired and/or wireless communication channels (e.g., networks, peripheral buses, etc.). The flight planning system 100 can be a system of one or more computers, or software executing on a system of one or more computers, which is in communication with, or maintains, one or more databases (e.g., databases 306-308), and is in communication with one or more user devices (e.g., user devices 310 and 150). The flight planning system 100 can be a system of one or more processors, graphics processors, logic circuits, analog circuits, associated volatile and/or non-volatile memory, associated input/output data ports, power ports, etc., and/or one or more software processing executing one or more processors or computers.

As described above, the flight planning system 100 can determine flight plans, including particular flight patterns for a UAV to follow, that are associated with performing inspections of structures (e.g., transmission towers associated with electromagnetic fields). The flight planning system 100 includes a flight plan determination engine 302 that can generate one or more user interfaces 316 (e.g., as will be described in FIGS. 6-7) for presentation on a user device (e.g., User Device A 310), that enable a user of the user device to specify information associated with a flight plan. The flight planning system 100 can be in communication with User Device A 110 over a wired or wireless connection (e.g., the Internet, a Local Area Network, a Wide Area Network, and so on), and the user of the User Device A 110 can provide user input 340.

To describe one or more locations of structures at which the flight plan is to be conducted, a user interface 316 may be configured to receive, from the user of User Device A 310, location information associated with the flight plan (e.g., GNSS coordinates of transmission towers), and the flight plan determination engine 302 can obtain information describing the location. For instance, the information can include right of way information (e.g., property boundary, easement) associated with a structure (e.g., obtained from a database such as the Property/Utility database 306, or a system, that stores or can access property information. Additionally, the flight plan determination engine 302 can obtain imagery, such as geo-rectified imagery (e.g., satellite imagery), associated with the entered location information. The flight plan determination engine 302 can include some or all of the information describing the location (e.g., the obtained imagery or right of way information) in an interactive user interface 316 to be presented to the user of User Device A 310.

The user of User Device A 310 may interact with user interfaces 316 to describe a geofence (e.g., a property geofence as described above) for a UAV to enforce. For instance, the flight plan determination engine 302 can provide imagery of a location, and a geofence can be presented on the user interfaces over the imagery (e.g., a geofence associated with the right of way).

Additionally, the user of User Device A 310 can specify information describing physical information of a structure, including a type of structure (e.g., a single circuit or multi-circuit transmission tower), a height of the structure (e.g., a height of a transmission tower, as described above), and locations/heights of portions of the structure of interest (e.g., heights of insulators, conductors, and so on). The information can be utilized by the flight plan determination engine 302 to determine a flight pattern for a UAV to implement (e.g., a flight pattern as described above, with respect to FIG. 1 and FIGS. 2A-2F). An example user interface is described below, and illustrated in FIG. 7.

Additionally, as described above the flight plan determination engine 302 can determine a standoff distance associated with a structure. For instance, the engine 302 can access the property/utility database 306 and determine a maximum, minimum, and optionally mean load associated with the structure (e.g., power carried by the structure). The flight plan determination engine 302 can then determine a standoff distance based on the load, for instance based on a maximum load associated with the structure. Optionally, the user can enter a particular time associated with the inspection (e.g., time of day, day of week), and the flight plan determination engine 302 can determine a standoff distance associated with the particular time. As will be described, an operator utilizing a ground control system 150 can determine a measure of current being carried by the structure (e.g., while location located proximate to the structure), and can incorporate the measure into the flight plan.

A user interface 316 can further enable the user to describe safe locations for a UAV to begin the flight plan (e.g., a take-off location) and end the flight plan (e.g., a landing location). As an example, the flight plan determination engine 302 can analyze the obtained imagery associated with the entered location information, and identify a geometric center of a convex area (e.g., a biggest convex area) within the geofence boundary that does not include obstructions (e.g., trees, cell phone towers, powerlines, buildings), such as an open pasture. Similarly, the flight plan determination engine 302 can obtain topological information associated with the entered location information, and can detect substantially flat areas (e.g., areas with less than a threshold of variance in height). For instance, the flight plan determination engine 302 can determine that an open clearing (e.g., an open clearing that is substantially flat) is a safe location for the UAV to take-off from, and can provide information recommending the open clearing in an interactive user interface 316 presented on the user device 310. Additionally, the flight plan determination engine 302 can analyze the obtained imagery and locate physical features that are known to generally be safe locations for take-off and landing. For instance, the flight plan determination engine 302 can determine that a road (e.g., a dirt road, a paved road) associated with access to a structure (e.g., transmission tower), is a safe take-off location.

The flight plan determination engine 302 can determine a flight plan from the received, and determined, information, for instance the property geofence, physical information associated with the structure, take-off location, standoff distance, and so on. The flight plan specifies a flight pattern associated with inspecting the structure, which as described above with respect to FIGS. 1 and 2A-2F, enables the UAV 320 to capture images of the structure.

After determining the flight plan, the flight plan determination engine 302 can generate a flight package 304 to be provided to the UAV 320, with the flight package 304 specifying information sufficient to implement the determined flight plan. Optionally, the flight package 304 can be formatted according to a particular UAV 320 (e.g., a particular type), or to particular flight control systems, and/or software versions, included in the UAV 320. Optionally, the flight package 304 can include a flight manifest file (e.g., an XML file) identifying necessary application and version information to conduct the flight plan. For instance, the UAV can be required to execute a particular application (e.g., "app" downloaded from an electronic application store) that provides functionality necessary to conduct the flight plan. As illustrated, User Device B (e.g., the ground control system 150), such as a tablet, laptop, wearable device, smart phone, or other user device that includes one or more processors, can receive the flight package 304 (e.g., over a wired or wireless connection). The ground control system 150 can be operated by an operator located proximate to a UAV performing the flight plan.

Figure 6:
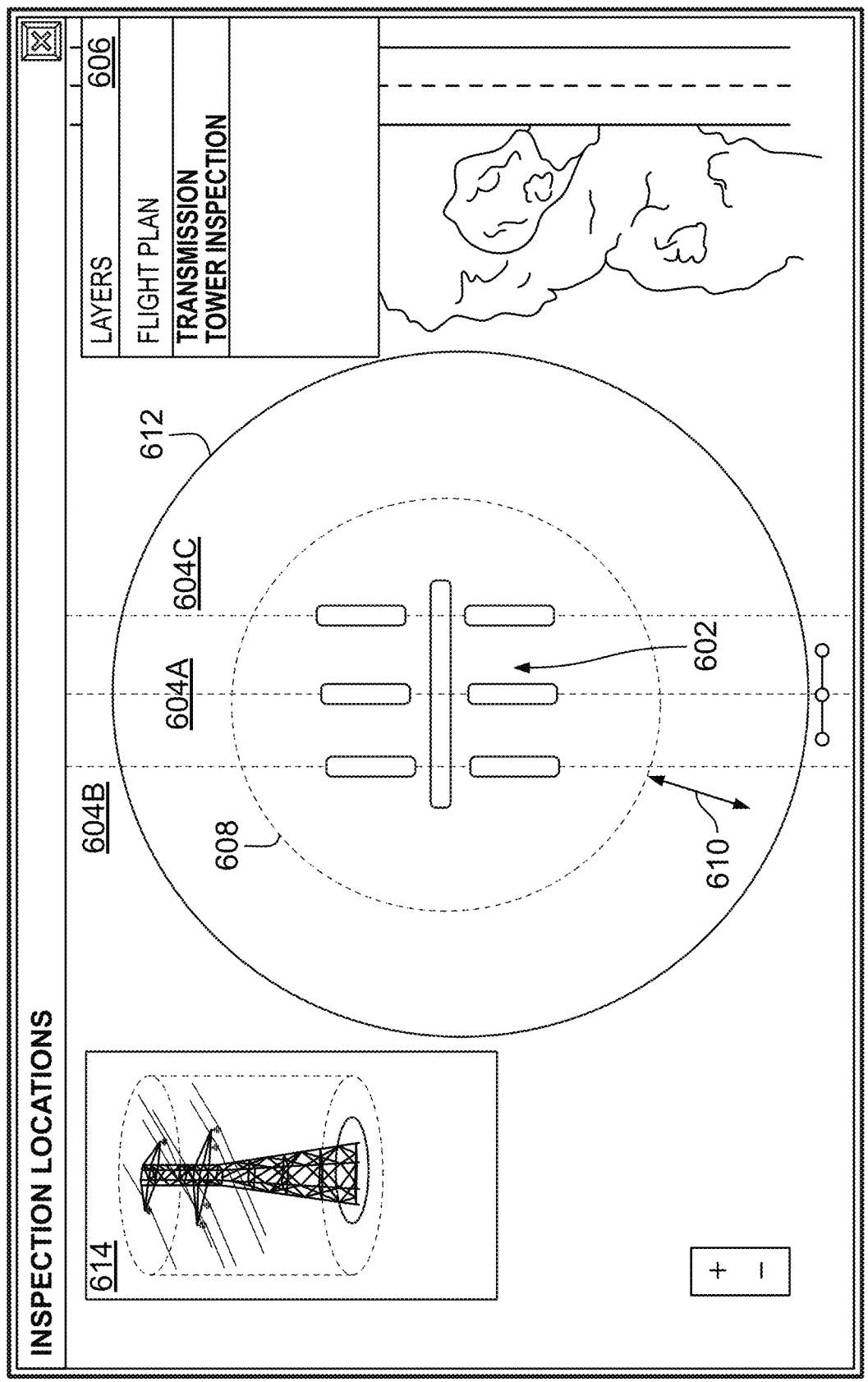
FIG. 6 illustrates an example user interface for generating a flight plan associated with inspecting a structure.

The ground control system 150 can present one or more user interfaces that describe the received flight package 304, such as user interfaces illustrated in FIGS. 6-7, and can enable an operator to modify one or more aspects of the flight plan. Optionally, the entire flight plan can be created by the operator utilizing the ground control system 150. As an example of modifying the flight plan, upon arriving at the location to be inspected, the operator can determine that a launch location is to be moved, or that a landing location is to be moved. Similarly, the operator can determine information indicative of an electromagnetic field of the structure, and the ground control system 150 can update the flight plan based on a determined standoff distance.

Figure 3B:
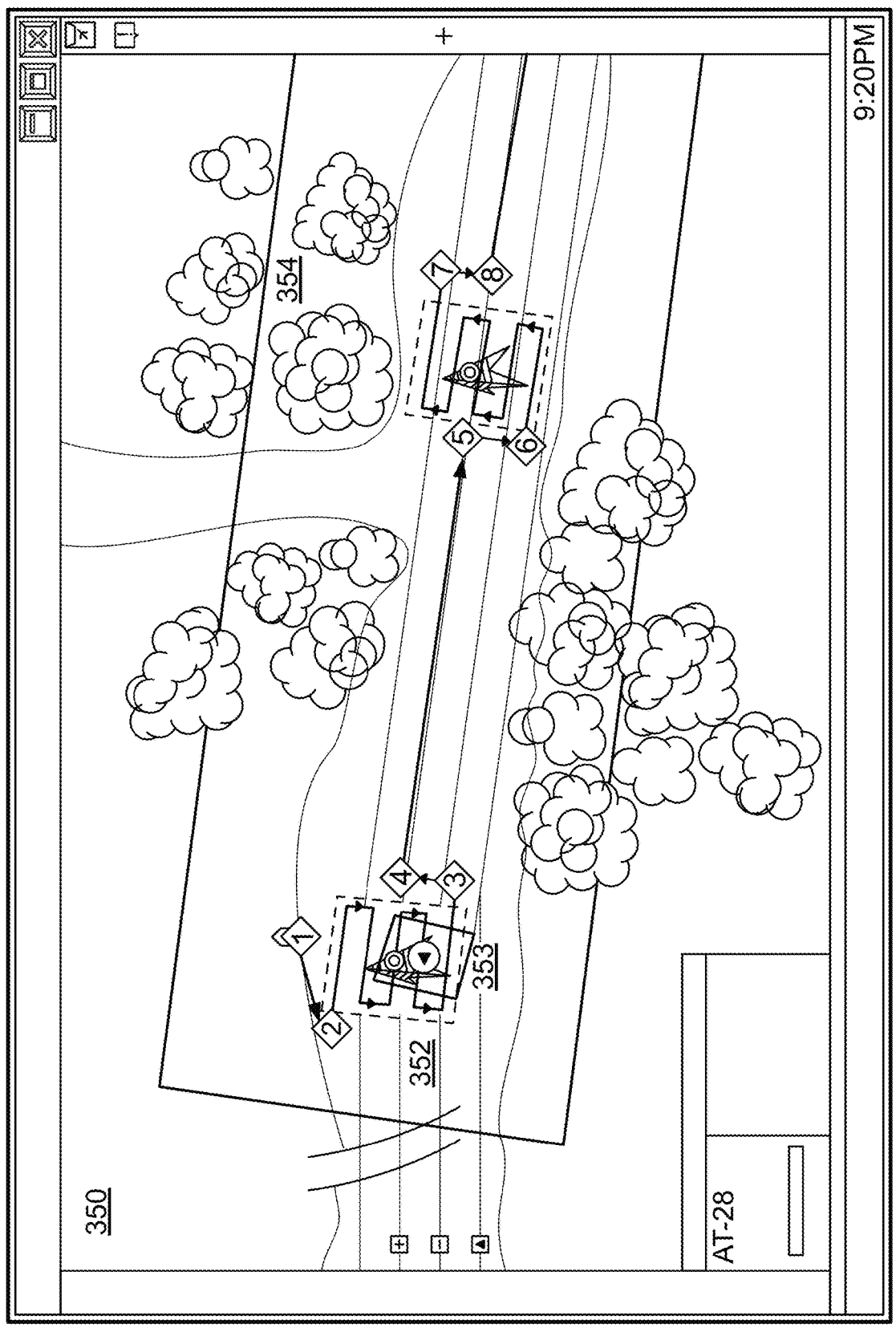
FIG. 3B illustrates a representation of a UAV performing a flight plan.

The ground control system 150 can then provide the flight package 304, or an updated flight package 334 (e.g., modified as described above), to the UAV 320. As the UAV 320 navigates according to the flight plan indicated in the flight package 304, or updated flight package 334, the UAV 320 can provide captured imagery to the ground control system 150 for presentation. Additionally, as the UAV 320 conducts the flight plan, the ground control system 150 can present a graphical representation of the progress of the UAV 320. For instance, the user device can present imagery (e.g., satellite imagery) of the survey area along with a representation of the flight pattern the UAV is to follow. The UAV 320 can provide geospatial location information to the ground control system 150, and the ground control system 150 can update a representation of the UAV 320 as it travels. For instance, as illustrated in the example user interface 350 of FIG. 3B, a representation of a UAV 352 performing a flight plan is illustrated. The UAV 352 is performing an inspection of a transmission tower, and a flight pattern the UAV 352 is following is identified. The example flight pattern includes 5 portions, for instance a first portion to inspect a side of the tower, subsequent portions along each conductor (e.g., three conductors), and a final portion to inspect the other side of the tower. As illustrated in FIG. 3B, there are four waypoints associated with the flight plan, a first waypoint associated with a takeoff location, a second waypoint associated with a start of the flight pattern to inspect the tower (e.g., a start of an inspection area, in which the transmission tower will be inspected as described above with respect to FIGS. 1, 2A-2F), a third waypoint associated with an end of the inspection, and a fourth waypoint associated with a transmission (e.g., along a corridor associated with a same right of way) to a subsequent transmission tower 354.

Referring to FIG. 3B, a flight pattern for one or more towers/structures along a corridor may be generated. A user may select the multiple towers/structures for inspection via a user interface of the ground control system 150 or of the flight planning system 100. In one embodiment, the user is presented with an aerial image, such as a satellite image, and the user selects the one or more towers to be inspected. When the tower is selected based on the imagery, the geo-spatial location of the selection may be cross-referenced with a database of towers, or other structures, and a flight pattern for the type of tower may be generated for the tower. The database of towers and/or other structures may include a tower/structure identifier, such as an asset id, one or more geospatial locations reference the tower/structure, a height of the tower/structure, a last inspection date, a tower/structure type, and other information related to the particular tower structure. Additionally, the user interface of the ground control system 150, or the flight planning system 100, may receive a geospatial location of the tower.

When the tower/structure is selected, the type of tower can be identified from the database. A unique flight pattern may be associated for each type of tower. As will be described below, a 5-leg inspection survey pattern will be used for a three-circuit tower type. Along the flight pattern, the UAV may periodically trigger sensor(s) to obtain sensor information describing the tower, circuits, or conductors.

FIG. 3B illustrates two three-circuit tower types, tower in the tower inspection area 353 and the tower 354. A particular inspection pattern for the type of tower may be generated based on the determined type of the tower/structure. In the example shown, the inspection pattern includes five substantially parallel legs, and can be referenced as a 5-leg tower inspection survey. For the top-most leg (leg 1), beginning at diamond 2, the UAV follows a path along the side of a circuit or the tower. During leg 1, a gimbal mounted camera (or other sensor) may be angled towards the tower/structure. This allows the UAV to obtain sensor data describing a side of the tower from an oblique view point. Next, the UAV moves from leg 1 to leg 2, where the UAV substantially follows a circuit. Leg 2 may be substantially parallel to leg 1. The camera (or other sensor) may be angled to obtain a nadir view of the tower as the UAV passes over it. Additionally, the camera (or other sensor) may be angled towards the structure as the UAV moves toward it, and then transitions the camera to a nadir view pointing down towards the tower, and then as the UAV passes over the tower moving towards the end of leg 2, the camera (sensor) may be angle towards the tower again. In other words, the gimbaled sensor moves in an arc, or sweeping fashion, as the UAV moves towards, over, and away from the tower. At the end of leg 2, the UAV moves to leg 3 (which is shown as the middle leg). Here the UAV would be moving in an opposite direction of leg 2. Again the UAV follows the circuit, and obtains sensor data as described for leg 2. Next, the UAV moves from leg 3 to leg 4. The UAV obtains sensor data as described above, and then moves from leg 4 to leg 5 where the UAV obtains oblique imagery similar to leg 1. The completion of leg 5 ends at diamond 3. The UAV would move in same direction for legs 1, 3 and 5, and in the same direction for legs 2 and 4. Each of the legs may be equidistant apart, or only legs 2, 3 and 4 may be equidistant apart, with legs 1 and 5 either closer, or farther apart from their adjacent legs 2 and 4 respectively. The UAV while conducting the 5-leg tower inspection survey may fly at a constant altitude for each of the legs, or for those legs (2, 3 and 4) over the circuits. The altitude may be determined by using a height above the known-height of the structure, and/or additionally adding a standoff distance based on an electro-magnetic field as discussed herein.

If more than one tower is part of the survey, the UAV transitions from the first tower to the second tower. In this example, at the end of leg 5 ending at diamond 3, the UAV moves to the center circuit from diamond 3 to 4. At diamond 4 the flight pattern creates an adjoining segment between the two towers. While the flight pattern may create an adjoining segment, for example between diamonds 3 and 6 along the bottom-most circuit, moving the UAV to the center conductor from diamond 3 to diamond 4 allows the UAV to obtain a better view of each of the 3 circuits as the UAV traverses to the second tower 354. The UAV may transition to a higher altitude to obtain a better vantage point. The UAV according to the flight pattern then reach diamond 5, then moves to diamond 6, where the 5-leg tower inspection survey is repeated with the first leg beginning at diamond 6, and the fifth leg ending at diamond 7. This flight pattern as discussed above, then may be repeated for subsequent towers.

Although in one embodiment of the invention, the flight planning system 100 may be primarily used to create and transmit a flight package to a UAV or ground control system, the UAV or ground control system can initiate the request for a flight package from the flight planning system 100. An operator may take the UAV or ground control system to a property location (e.g., a location of a structure being inspected). The UAV or ground control system may then request a flight package, or an updated flight package using its current position. For example, the UAV or ground control system can determine its geospatial position via a GNSS receiver (using GPS, GLONASS, Galileo, or Beidou system). The UAV or ground control system can then transmit its location information to the flight planning, along with other identifying information about the requesting device, such as its UID, or MAC address, etc. The flight planning system 100 can then receive the request, and determine if an updated or changed flight package exists by comparing the device identifier a database storing the new or updated flight package information. If a new or updated flight package exists, then the flight package can be transmitted from the flight planning system 100, and received by the UAV or ground control system. A confirmation acknowledging receipt of the flight package may then be transmitted from the UAV or ground control system to the flight planning system 100. The flight planning system 100 can then update a database specifying that the particular flight package has received. Moreover, the UAV or ground control system can supply the property location, and a new job request (e.g., new inspection) can be sent to the flight planning system. The flight planning system 100 may then create a new flight package for the UAV or ground control system.

Figure 4:
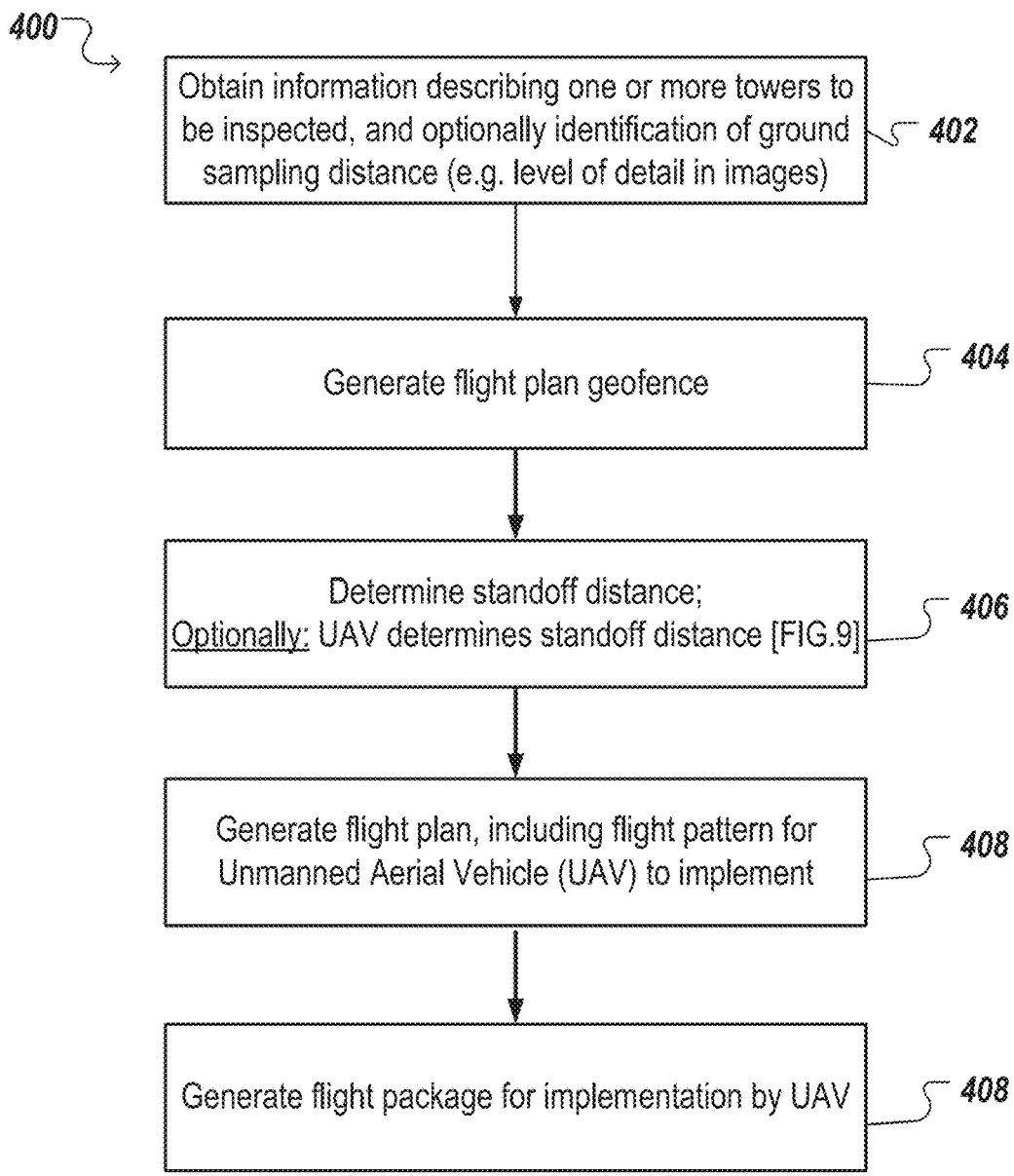
FIG. 4 illustrates an example process of generating a flight package to be provided to UAV to perform an inspection of a structure.

FIG. 4 illustrates an example process of generating a flight package to be provided to an unmanned aerial vehicle (UAV) to perform an inspection of a structure (e.g., a transmission tower). For convenience, the process 400 will be described as being performed by a system of one or more computers (e.g., the flight planning system 100). The process 400 can also be performed in concert with, or exclusively with, the ground control system 150.

The system obtains information describing a structure to be inspected (block 402). As describe above, the system can present user interfaces associated with inspecting a structure (e.g., illustrated in FIGS. 6-7), and a user can specify particular information associated with the structure. For instance, the user can input location information (e.g., latitude and longitude of the structure), or the user can specify an identifier associated with the structure (e.g., a governmental identifier, for instance an identifier assigned to the structure by a public or private utility company). The system can obtain imagery (e.g., satellite imagery) of the structure, and can present the imagery to the user. Utilizing the imagery, the system can determine a property geofence associated with a right of way of the structure. Additionally, the system can access information (e.g., information maintained by the public or private utility company), and can determine right of way information for the structure (e.g., property boundary information, information associated with an easement, and so on).

In addition to location information, the user can input a type of the structure (e.g., a single circuit, multi-circuit, three-phase power, and so on, transmission tower), along with a height of the structure and location information associated with insulators, attachments, and so on. Optionally, the system can access information (e.g., information maintained by the public or private utility company), and can utilize the information to automatically input (e.g., without user interaction), the information describing the structure. The system can also access prior flight plan information, and obtain the information from a prior flight plan associated with inspecting the structure. The system also receives information indicating a ground sampling distance (e.g., a required level of detail to be included in images). As described above, the ground sampling distance can be maintained by the UAV as a constant, by varying a focal length of a lens of the UAV's camera according to a present position of the UAV with respect to the structure. The ground sampling distance can also be maintained as a minimum, such that each image captured by the UAV includes at least the minimum level of detail associated with the ground sampling distance.

The system generates a flight plan geofence (block 404). As described above, the system generates a geofence according to right of way information associated with the structure.

The system determines a standoff distance (block 406). As described above, the system can determine a standoff distance from the structure, which as described above represents a distance at which a UAV can properly navigate, utilizing load information associated with the structure. Optionally, the UAV can determine a measure of an electromagnetic field strength during a flight plan, and modify the flight plan based on the measure, which will be described below with respect to FIG. 9.

As described above, the flight plan can be generated using the flight planning system 100, the ground control system 150, or optionally the ground control system 150 can receive a flight plan and a user of the ground control system 150 can modify the received flight plan. For instance, an operator located proximate to a transmission tower a UAV is going to inspect, can determine that a take-off location, landing location, associated with the flight plan is to be moved (e.g., obstacles, such as trees, trucks, machinery, and so on, may be too close to the locations). The operator can then modify the take-off location, landing location, of the flight plan, and the ground control system can generate an updated flight package to be provided to the UAV.

Similarly, the operator can determine a load through the transmission tower, and an actual standoff distance (e.g., based on empirical information identifying current through the conductors) can be determined. For instance, as described above, the operator can measure information indicative of the current (e.g., the operator can measure an electromagnetic field at one or more locations proximate to the transmission tower), and using a location of the operator from the tower, the standoff distance can be determined. Additionally, the operator can receive load information from a utility company associated with the transmission tower.

The standoff distance can be utilized to update the flight plan, for instance an altitude at which the UAV is to navigate may be modified (e.g., raised or lowered depending on the standoff distance). As will be described, for instance in block 408, the system (e.g., ground control system) can determine that an angle at which a camera of the UAV is to be pointed needs to also be modified. For instance, if the standoff distance determined using actual load information indicates that the UAV will have to be at a higher altitude, the angle of the camera may need to point closer to vertically downwards (e.g., the UAV may have to be closer to the transmission tower to obtain images of the bottom portion of the tower at the ground sampling distance). The system can further determine that, based on the camera having a variable focal length lens, the angle can remain the same, and the UAV can determine that it has to zoom in on the bottom portion to capture images at the ground sampling distance. Optionally, the system can specify the focal length in the flight plan.

A standoff distance by input or calculated by the flight planning system by taking one or more manual readings of a power line, transmission tower, or other structure using a Gauss meter or a Tesla meter. For example, an operator may stand proximate to a location near the structure. A reading may be taken of the magnetic field at the location. Additionally, a laser range finder may be used to estimate the distance at the location of the measurement and the structure. The measured distance to the structure and the measure magnetic field readings may be input to the flight planning system. Based on a magnetic field model, a standoff distance from the structure may be determined.

The standoff distance may be determined by various methods, however, in one implementation the standoff distance may be determined using a magnetic field drop-off model as magnetic fields fall off with the distance from the source. A magnetic field measurement from a source is obtained. Additionally, a distance is determined from the structure source and the location where the measurement was taken. A stand-off model may be used to then select a standoff distance where the selected stand-off distance would be at or below a predetermined threshold value.

The system generates a flight plan (block 408), and flight package (block 410). The system utilizes the information obtained, or determined, in blocks 402-406, to determine a flight plan for a UAV to implement. As described above, with respect to FIGS. 2A-2F, the flight plan can cause the UAV to navigate along a portion of the structure, at an altitude above the structure based on the standoff distance, and capture images of the structure. For instance, while navigating over one or more conductors the UAV can ascend to at least the standoff distance altitude, and while navigating along the sides of the conductors (e.g., FIG. 2F), the UAV can ascend to lower than the standoff distance since it is also located laterally away from the conductors. Alternatively, the UAV can always remain at a same altitude along the flight plan As an example of determining a flight plan, the system can determine a number of circuits (e.g., as illustrated in FIGS. 2A-2F, each circuit can include vertically arranged conductors, alternatively each circuit can include horizontally arranged conductors), and based on an orientation of the circuits (e.g., whether the conductors are arranged vertically or horizontally), can determine the flight pattern. That is, as described above, the system can determine that a flight pattern indicated by the flight plan is to include a number of portions indicated by a number of conductors that are horizontally spaced apart. For instance, a transmission tower with 3 circuits, with 3 conductors per circuit that are arranged horizontally, will include 3 portions. Each portion will include a UAV capturing images from a lowest portion of the transmission tower, vertically up the transmission tower, and thus capturing images of the three conductors arranged vertically. As another example, and as described in FIG. 2B, a transmission tower can include three circuits each with three conductors arranged horizontally, where a middle circuit can include conductors on the ends of the transmission tower which extend further than conductors on the ends of the transmission tower associated with the top and bottom circuits (e.g., illustrated as example transmission tower 714 in FIG. 7). The system can determine, for this example transmission tower, that the middle located conductors are spaced too far horizontally from the conductors above and below them (e.g., based on a ground sampling distance, the UAV may not include images of the middle conductors when capturing images vertically up the transmission tower), and can include respective portions associated with inspecting the conductors. That is, the flight plan can include a portion to inspect the middle conductor along a particular side, then the upper and lower conductors along a subsequent side, and so on until the transmission tower is imaged.

Optionally, the system can determine that the flight plan is infeasible based on the ground sampling distance and the determined standoff distance. For instance, the system can determine that the UAV is to remain at too great a distance from the structure (e.g., altitude of the UAV, and a distance from the structure indicated by an angle of a camera pointing at the transmission tower with respect to a vertical downward direction), to be able to capture images of the structure at the ground sampling distance. Optionally the system can determine recommendations of cameras that a UAV is to utilize, for instance the system can determine (e.g., based on configuration information identifying available cameras) that particular focal lengths will allow a UAV to capture images of a transmission tower at the ground sampling distance while remaining at the standoff distance.

The system can further utilize information describing physical characteristics of a transmission tower, for instance the height of the transmission tower, to determine whether the UAV can capture images of the entirety of the tower. For an example tower that is greater than a threshold height (e.g., with supporting conductors located near a top of the tower), the UAV (e.g., based on the standoff distance) may be unable to capture images of a bottom portion of the tower at the ground sampling distance. The system can present information indicating that the flight plan is infeasible, and optionally a user can override the indication and modify the flight plan. In the scenario of the UAV being unable to capture a bottom portion of the transmission tower, the user can indicate that the UAV can begin capturing images of higher portions of the transmission tower (e.g., the UAV can utilize information identifying locations of insulators, attachments to the tower, to capture images when these portions enter a field of view). That is, the user can specify that the flight plan can skip capturing images of the bottom portion. Optionally, the system can determine that a variable focal length lens can be utilized, and can determine that the UAV is to zoom in when capturing images of the bottom portion. In this way, the flight plan can capture images of the entirety of the tower.

Similarly, the system can determine, based on a camera to be utilized by a UAV when implementing the flight plan, that while the camera may be able to capture images of the entirety of the tower at the ground sampling distance, the camera may not be able to capture images (e.g., free of distortion) at a high enough shutter speed. That is, if the UAV is navigating at an altitude greater than a threshold, the focal length utilized by the UAV (e.g., variable focal length) may have to be too great such that to avoid motion blur, the shutter speed may have to be greater than a threshold (e.g., $\frac{1}{1250}$, $\frac{1}{2000}$). To compensate for the high shutter speed, a high ISO may have to be used to correctly expose the image and resulting distortion from the high ISO may be unacceptable, and/or an aperture of the lens at the high focal length may not be wide enough to enable the camera to correctly expose the image at an acceptable ISO and shutter speed (e.g. a shutter speed for which motion blur is accounted). The system an similarly determine that the flight plan is infeasible, and the user can specify that the UAV is capture images at a higher portion of the tower, and ignore the bottom portion of the tower (e.g., capture images of the insulators, attachments, and so on). Optionally, the system can determine times at which an amount of sunlight is greatest (e.g., the system can access weather prediction information, and determine a time expected to be sunny), and the system can determine whether the amount of sunlight will enable the UAV to capture images at a correct exposure. Since images can be corrected for exposure after being captured (e.g., photo-editing software), the user can override the determination and the flight plan can continue.

Alternatively, in contrast to skipping the bottom portion of the tower, the system can determine an angle at which the camera is to be pointed at the transmission tower (e.g., along each portion, as described in FIGS. 2A-2D), such that the entirety of the transmission tower can be included in images. For instance, as described in FIG. 2B, the system can select the angle to ensure that, based on the height of the transmission tower and standoff distance, the bottom portion of the transmission tower can be imaged at the level of detail associated with the ground sampling distance. That is, the system can determine that the UAV is to be closer to the transmission tower (e.g., with respect to a ground distance), such that the angle is closer to a vertical downward direction, than other transmission towers (e.g., transmission towers lower in height or with a smaller standoff distance).

However, using information describing the transmission tower (e.g., a model of the transmission tower, physical information), the system can determine that if the angle of the camera is smaller than a threshold (e.g., with respect to a vertical downward direction), the UAV will be unable to capture images of a middle portion or upper portion of the transmission tower. That is, as the UAV navigates closer to the transmission tower, if the angle is smaller than the threshold, features of the transmission tower (e.g., upper insulators, conductors, attachments, ground wires, the mass of the tower, and so on) may block a field of view of the UAV as it captures images of, for instance, a middle portion of the transmission tower. The images may be too close to nadir images, and not oblique images, to avoid obstacles (e.g., insulators, conductors) on the transmission tower that are located vertically above a portion of the tower being imaged. Therefore, in this situation, the system can determine that a bottom portion of the transmission tower is unable to be imaged, and the system can modify the angle of the camera to point at greater than the threshold angle such that the transmission tower, absent the bottom portion, can be imaged.

For situations in which a variable focal length lens is being utilized, the system can determine that the UAV is to use a high focal length for the bottom portion (e.g., in situations in which the bottom portion is unable to be captured, for instance as described above). The system can then determine focal lengths to utilize along the flight plan such that the entirety of the transmission tower can be imaged.

Furthermore, as illustrated in FIG. 3B, the system can determine an inspection area 353 associated with inspecting the transmission tower. The inspection area can extend from a threshold distance from behind the transmission tower (e.g., along the conductors) to a threshold distance in front of the transmission tower (e.g., along the conductors). As described above, with respect to the FIGS. 2A-2F, the threshold distance can be based on a location at which the transmission tower first enters a field of view of the UAV, and leaves a field of view of the UAV. That is, the inspection area 353 represents an area in which the UAV is to navigate to capture images of the transmission tower. Optionally, the system can cause a geofence to be generated that is associated with the inspection area 353. The geofence can be further associated with a time of existence, for instance the UAV can be constrained to the geofence during the inspection, and can be disabled if the UAV is to navigate along a corridor to a subsequent transmission tower (e.g., associated with its own geofence). Optionally, the UAV can be constrained to the inspection area 353 geofence, and after inspecting a transmission tower, can request that an operator (e.g., using a ground control system) allow the UAV to exit the geofence.

After generating the flight plan, the system generates a flight package to be provided to a UAV. As described above, the flight package includes information sufficient to enable the UAV to perform the flight plan.

Figure 5:
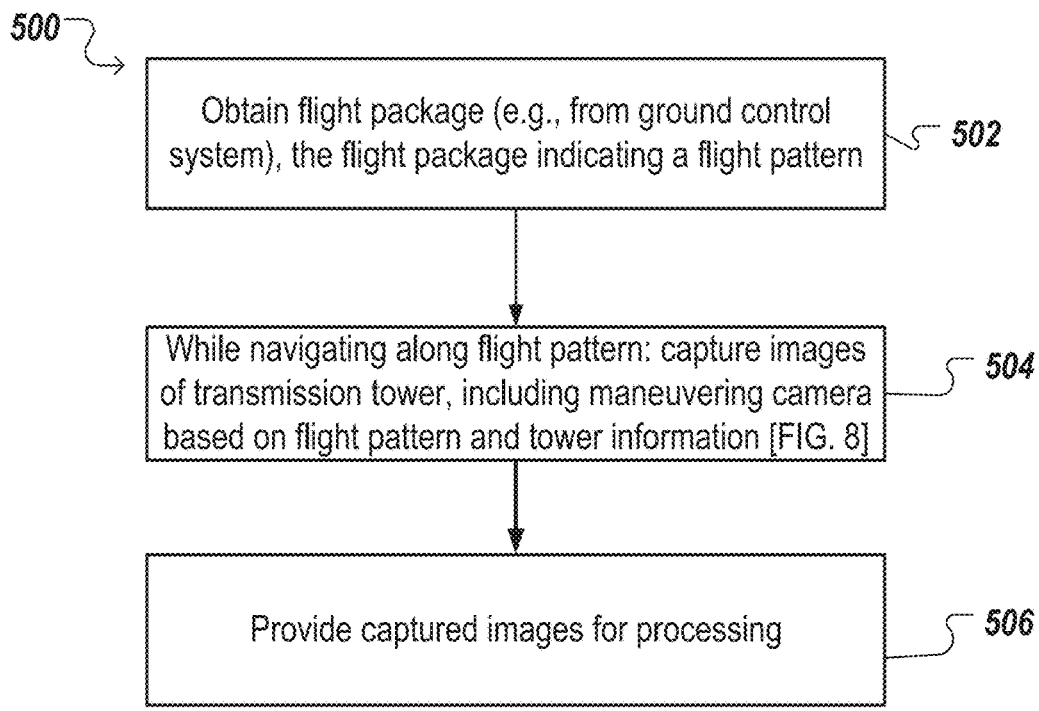
FIG. 5 illustrates an example process of a UAV implementing a received flight plan.

FIG. 5 illustrates an example process 500 of a UAV implementing a received flight plan. For convenience, the process 500 will be described as being performed by an unmanned aerial vehicle (UAV) of one or more processors (e.g., a UAV implementing the UAV primary processing system 1000 described in FIG. 10).

The UAV obtains a flight package, indicating a flight pattern for implementation (block 502). The UAV obtains the flight package from a ground control system utilized by an operator positioned proximate to the UAV. For instance, the operator can bring the UAV to a take-off location, and can utilize the ground control system to indicate that the UAV is to ascend from the take-off location and begin an inspection of a structure (e.g., a transmission tower). As described above, the operator can determine a load being carried by conductors supported by the structure, for instance by performing measurements (e.g., using a flux meter), or by obtaining actual load data (e.g., from a utility company). The operator can input the load information into a user interface presented on the ground control system, for instance user interface 700 described in FIG. 7, and a flight plan that incorporates a determined standoff distance can be generated and provided to the UAV.

The UAV navigates according to the flight plan, and captures images of the structure (block 504). As described above, with respect to FIGS. 2A-2F, the UAV navigates along one or more conductors of the structure, and captures images of the structure. The UAV can determine to capture images upon determining that a field of view of a camera includes the structure, for instance based on a present location of the UAV, location information of the structure specified in the received flight package, and a field of view of the camera (e.g., a focal length of a lens, and so on). Examples of capturing images will be further described, with respect to FIG. 8.

The UAV provides captured images for processing (block 506). Upon completing of the flight plan, the UAV provides the captured images to the ground control system, which can begin processing the images (e.g., using photogrammetry software) to generated a 3D model, such as a 3D point cloud, of the structure. That is, the ground control system can combine (e.g., stitch together) images of the structure. The generated 3D model, 3D point cloud, and individual captured images, can be maintained by a system of one or more computers (e.g., the flight planning system 100, or a cloud system that maintains information associated with inspections). A user of the ground control system, or a user viewing the generated information, can mark locations of damage, and types of damage, and label information associated with the damage can be applied to marked locations. In this way, a user can view the generated 3D model, or generated 3D point cloud, and access information indicating damage to the structure. The user can then select locations at which damage was indicated, and view detailed images (e.g., obtained by the UAV) of the damage.

FIG. 6 illustrates an example user interface 600 for generating a flight plan associated with inspecting a structure (e.g., a transmission tower). The user interface 600 includes indications of conductors supported by a structure (e.g., conductors 604A-604C), along with a footprint of the structure 608, and a geofence 610 associated with a right of way of the structure, or associated with an inspection area (e.g., as described above, with respect to FIG. 3B and FIG. 5).

FIG. 7 illustrates an example user interface 700 for describing physical information associated with a transmission tower. The user interface 700 is an example of a user interface 700 that can be generated (e.g., by the ground control system 150, or flight planning system 100) for presentation to a user. The user interface 700 can be associated with a document (e.g., a web page), which can be rendered for presentation to the user, or the user interface 700 can be generated by an application (e.g., an "app" downloaded from an electronic application store). As described above, with respect to at least FIGS. 2A-2F, physical information associated with a transmission tower can be utilized to determine a flight pattern (e.g., a standoff distance can be set from a surface on which a transmission tower sits, or from a height of the conductors), and utilized by a UAV to determine where to capture images of the transmission tower (e.g., a location from which the transmission tower enters a field of view of a camera of the UAV). The user interface 700 can be utilized to determine a model of a transmission tower being inspected. That is, the system can generate information describing a 3D model of the tower, which the UAV and/or system can utilize to determine the flight plan. Additionally, the UAV can utilize the 3D model to determine locations at which to capture images of the tower (e.g., as described above with respect to FIGS. 2A-2F).

The user interface 700 includes indications of types of transmission towers 702 that can be inspected, for instance a selected transmission tower is a single circuit transmission tower 706, and the user interface 700 includes a large representation of the selected transmission tower 710. A user of the user interface 704 can specify physical information associated with the transmission tower (e.g., the user can specify "specs" 704 associated with the transmission tower), for instance location information (e.g., longitude/latitude coordinates of a centroid of the transmission tower), and so on. Upon interaction with a particular type of physical information, for instance a height of conductors 712A being supported by the transmission tower (e.g., 50 feet as illustrated in FIG. 7), the corresponding physical features associated with the information can be identified or highlighted on the large representation 710 (e.g., the distance from the conductors to a bottom of the transmission tower 710 can be identified).

Similarly, other physical information can be indicated for the selected type of transmission tower 706. For instance, the selected transmission tower 706 includes three conductors at a same height and located horizontally a particular distance from each other. The selected type of transmission tower 706 further includes two ground wires at the top of the tower (e.g., the two ground wires illustrated in the large representation 710). Each type of transmission tower 702 can be associated with features that the user can indicate, such that each type can be described with minimal user input. For the selected type of transmission tower 706, as a non-exhaustive list, the user can specify one or more of heights of conductors 712A (e.g., the height can be assumed to be constant for each conductor, optionally the user can indicate that the heights are different and specify respective heights), spacing between each conductor 712 B (e.g., spacing between the conductors, or a spacing from a center of the transmission tower can be indicated), distance between the ground wires 712C, a height of the ground wires 712D, and so on.

Other type of transmission towers, for instance a transmission tower with two circuits 708A, or a transmission tower with a single circuit and a different orientation of conductors 708B, can be associated with similar features that the user can describe. As an example of the transmission tower with two circuits 708A, the user can specify a height of each conductor (e.g., the user can specify three heights, for instance the heights of the conductors on the left, and the conductors on the right can be assumed to have parallel heights), a distance of each conductor from a center of the tower, and so on.

Optionally, the user can select a utility company (e.g., the user can enter a utility company name, or select from among a list of utility companies, such as for a region), and the user interface 700 can present information describing types of transmission towers used by the utility company (e.g., used in a particular user selectable region), such as images, or diagrams, of transmission towers. The user can scroll (e.g., on a touch sensitive screen, using a mouse, and so on) through images of the transmission towers (e.g., the images can be presented as the different types 702), and can select a particular type.

Optionally, the user can indicate parameters associated with a structure, and using the user interface 700, can move physical portions of a transmission tower around to create a new transmission tower. As an example, the user interface 700 can present components included in transmission towers, such as conductors, inductors, guy-wires, lattice work, and so on. The user can select from among a multitude of tower types, and can place conductors, or other components, at locations on a particular tower. The user can then provide values of parameters, such as heights of the conductors, and so on. An operator located proximate to a transmission tower can look at the transmission tower and therefore graphically describe the tower. Optionally, the operator can obtain an image of the transmission tower, and the ground control system 150 can analyze the image to identify features (e.g., feature matching, such as with computer vision techniques, the system 150 can perform an edge detection process and identify particular features included in the image), and the operator can then provide values of parameters for the features (e.g., heights of components, and so on).

Optionally, the user can provide a model (e.g., a CAD model, a 3D model generated from a prior flight plan, and so on) describing a transmission tower, and features can be extracted from the model. Optionally, the current, or load, carried by the transmission tower can be indicated, such that a standoff distance can be determined.

Figure 8:
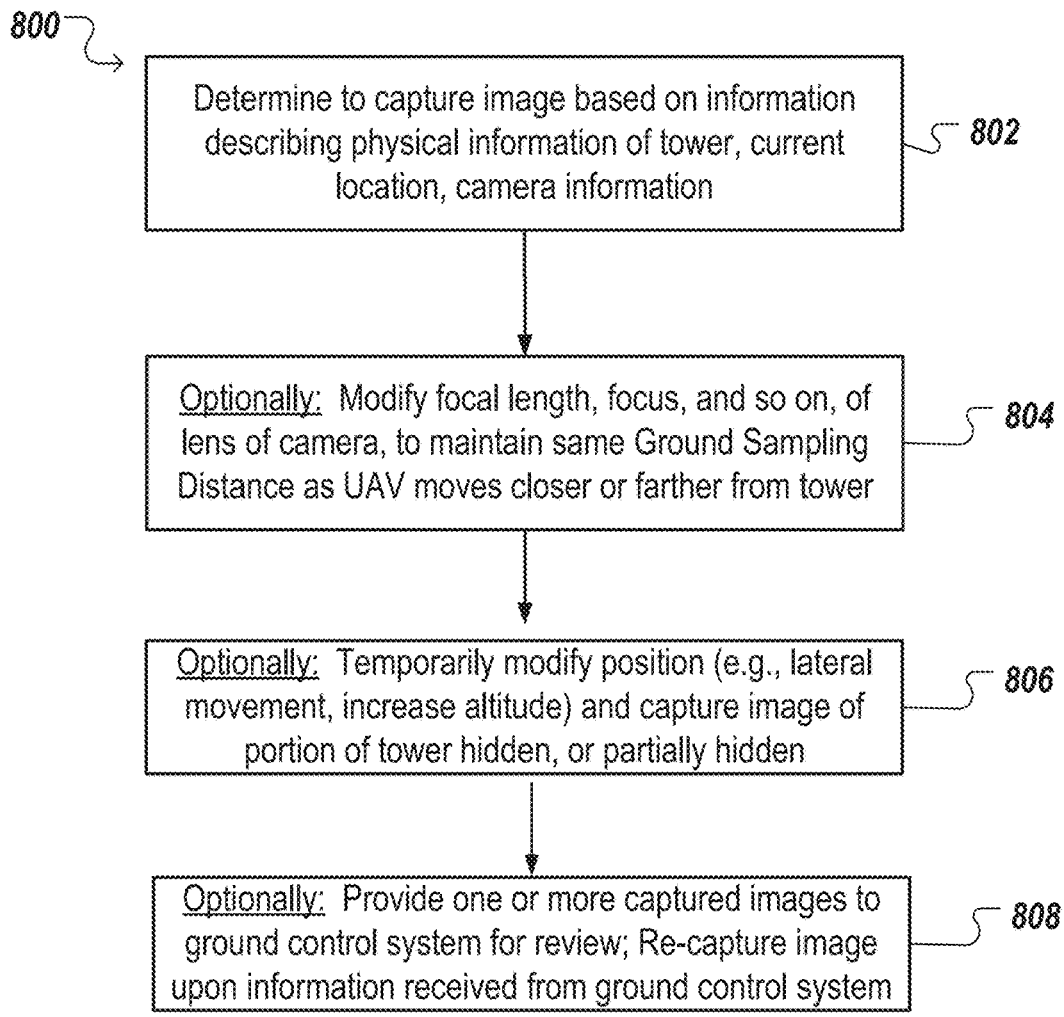
FIG. 8 illustrates an example process for capturing images of a structure.

FIG. 8 illustrates an example process 800 for capturing images of a structure (e.g., a transmission tower). For convenience, the process 800 will be described as being performed by an unmanned aerial vehicle (UAV) of one or more processors (e.g., a UAV implementing the UAV primary processing system 1000 described in FIG. 10).

The UAV determines to capture an image of the structure (block 802). As described above, with respect to FIG. 2B, the UAV can navigate along a flight pattern initially towards the structure, and can determine a location at which the structure enters a field of view of the UAV's camera. For instance, the UAV can utilize a GNSS receiver to obtain a present location of the UAV, and utilizing location information specified in a received flight plan (e.g., a location of the structure, along with a footprint of the structure, or a model of the structure), can determine a location along the flight pattern that the structure will enter the field of view. That is, the UAV can project the field of view of the camera onto a real-world area, and determine when the real-world area includes the structure. Subsequently, the UAV captures images of the structure periodically to obtain complete coverage of an ascending portion of the structure (e.g., as illustrated in FIG. 2B).

The UAV optionally modifies a focal length of a lens camera to maintain a same ground sampling distance (block 804). As described above, as the UAV navigates closer to the structure and captures images of the structure, a real-world area being captured in each image decreases. Therefore, each image includes greater detail, and thus a greater ground sampling distance, than the initial captured image. A user (e.g., an operator, or a user generating the flight plan) can specify that the UAV is to utilize a variable length lens to modify a focal length based on a distance of the UAV from the structure. In this way, the UAV can reduce the focal length as the UAV navigates closer to the structure, and can maintain a same ground sampling distance.

The UAV optionally modifies a position of the UAV to capture an image of a portion of the structure that is hidden, or partially hidden (block 806). As described with respect to FIG. 2B, the UAV can move laterally to capture an image of an insulator, attachment, and so on, that is hidden (e.g., out of view of the camera). Similarly, optionally the UAV can utilize computer vision techniques to identify a particular portion (e.g., an insulator). If the particular portion is determined to be partially hidden (e.g., a conductor is covering the portion, a tree is covering the portion, and so on), the UAV can modify its position to move laterally, or ascend, in an effort to view the entirety of the portion. For instance, if an insulator is partially covered by a conductor that is located vertically above the insulator, the UAV can determine that moving laterally in a particular direction (e.g., to the left or right), and then modifying an orientation of a gimbal that controls an attitude of a camera, will enable the UAV to capture images of the portion. The UAV can perform the maneuver upon determining that the maneuver will not violate a geofence (e.g., the property geofence associated with a right of way of the structure) and will not cause the UAV to be closer than the standoff distance.

The UAV optionally provides captured images to the ground control system for review (block 808). The UAV can provide images (e.g., reduced resolution versions of the captured images, or full resolution versions) to the ground control system (e.g., over a wireless connection such as Bluetooth, Wi-Fi, and so on), and the ground control system can determine whether the images pass one or more quality thresholds. Upon a negative determination, the ground control system can provide information to the UAV indicating that the UAV is to re-capture one or more images (e.g., the UAV is to navigate back to respective locations associated with capturing the images). The ground control system can determine quality information associated with the captured images, and request re-capture of images that are blurry, not sharp, out of focus, and so on. Quality information about captured images can be determined by sharpness measurements of the image. For instance, a frequency domain analysis of the image can be performed, and a lack of high frequencies can be indicative of a lack of focus (e.g., compared to an expected inclusion of high frequencies for the image). Additionally, a laplacian kernel can be convolved with the image (e.g., in the spatial domain) and the result can be used to determine blurriness of the image (e.g., intensity values of pixels within a threshold distance can be compared, and a blurry image can have a lack of comparisons greater than a threshold). Additional quality information can include brightness measurements, exposure measurements, contrast measurements, and so on.

Optionally, the UAV may have onboard GPU processing capabilities, and determine quality information (e.g., without providing images to the ground control system), and can automatically determine to re-capture images. Furthermore, the UAV can provide the captured images to the ground control system, and the operator can inspect the images and determine whether the images are acceptable.

Figure 9:
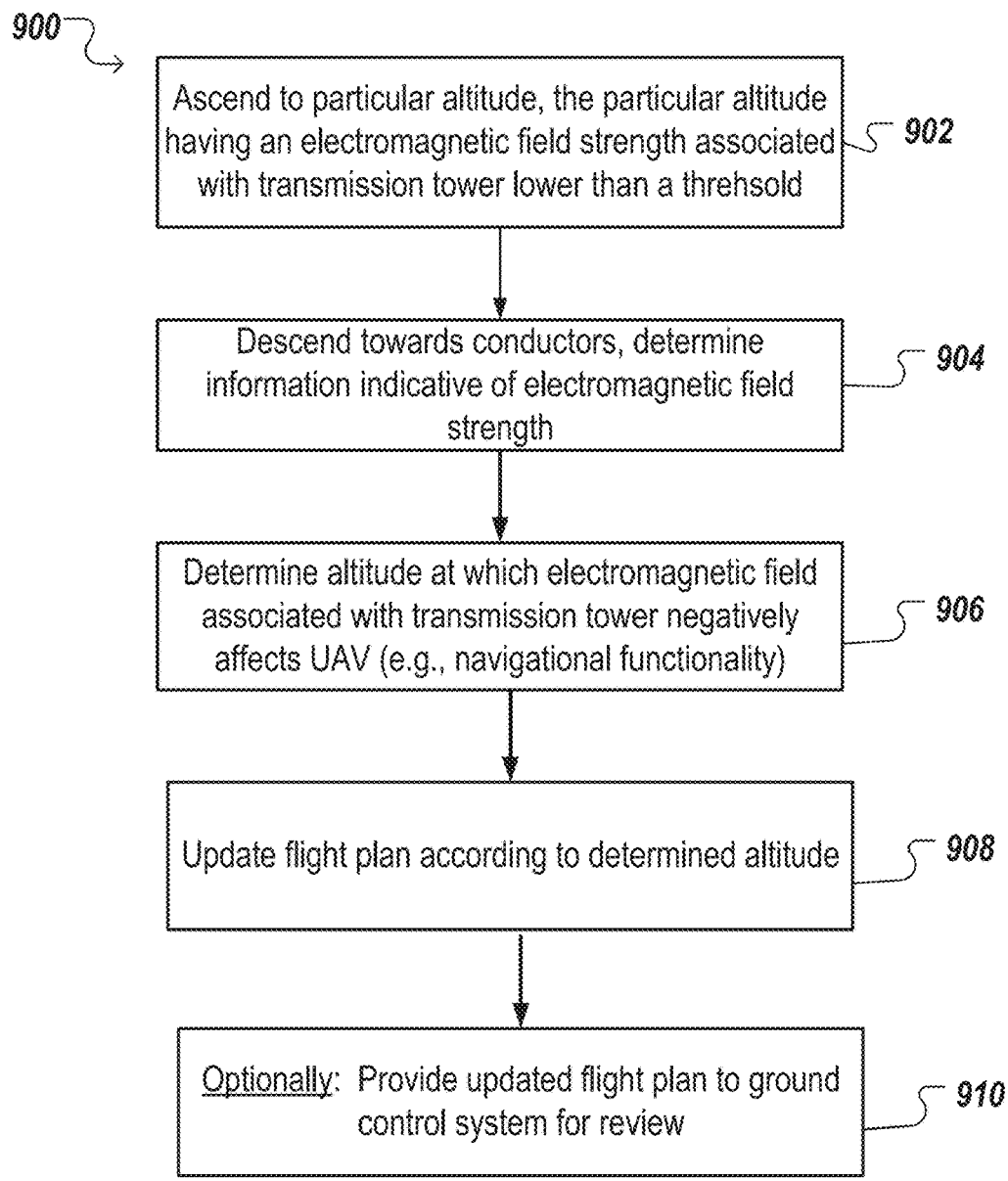
FIG. 9 illustrates an example process of a UAV determining a standoff distance.

FIG. 9 illustrates an example process 900 of a UAV determining a standoff distance. For convenience, the process 900 will be described as being performed by an unmanned aerial vehicle (UAV) of one or more processors (e.g., a UAV implementing the UAV primary processing system 1000 described in FIG. 10).

The UAV ascends to a particular altitude (block 902). The UAV can ascend from a take-off location (e.g., as illustrated in FIG. 2A), and ascend to an altitude at which an electromagnetic field associated with transmission towers is not expected to have any negative effects (e.g., 75 meters, 100 meters, and so on). The UAV navigates over conductors being supported by the transmission tower at the particular altitude.

The UAV descends towards the conductors (block 904). The UAV descends from the particular altitude towards the conductors, and determines whether an electronic compass is negatively affected. For instance, the UAV descends in a vertical line such that the UAV does not have to rely on the electronic compass for safe navigation (e.g., optionally the UAV can utilize flight models associated with GPS, and attitude information determined by an inertial measurement unit, to navigate in a straight direction downwards).

The UAV determines an altitude at which the electromagnetic field associated with the structure negatively affects the electronic compass (block 906). As described above, the UAV descends in a vertical line towards the conductors. The UAV determines whether a direction associated with north (e.g., magnetic north, true north, as determined using location information of the UAV), as indicated by the electronic compass, is moving. For instance, the UAV can utilize attitude information determined by the IMU (e.g., optionally in comparison to flight models) to ensure that an orientation of the UAV is not moving (e.g., the UAV is pointing in a same direction during descent). Optionally, the UAV can orient itself along a direction of the conductors, and as the UAV descends, the UAV can utilize captured images to determine that an orientation of the UAV has no changed. That is, the UAV can determine that it's facing a same direction during descent from the direction of the conductors as a reference point. The UAV can then determine an altitude at which the electronic compass produces a modified (e.g., greater than a threshold) north direction. The altitude is then assigned as the standoff distance associated with the structure.

The UAV updates a flight plan according to the determined standoff distance (block 908). Upon determining the standoff distance, the UAV updates the flight plan to specify the standoff distance. As described above, the UAV can ensure that it does not navigate below the standoff distance by enforcing a geofence surrounding the structure that is based on the standoff distance. Optionally, the UAV can utilize distance sensors (e.g., Lidar, Leddar, and so on) to determine a distance of the UAV from the structure (e.g., from conductors, or any portion associated with the structure).

As described above, with respect to FIG. 2B, the standoff distance can inform a particular angle that a camera of the UAV is to be pointed at. For instance, to ensure that a lowest portion of the structure is imaged at a specified ground sampling distance, the particular can be set such that a distance of the UAV from the lowest portion enables the camera to capture images of the lowest portion at the ground sampling distance. Upon the UAV determining the standoff distance, the UAV can then determine a particular angle that will enable, or determine that a particular angle indicated in the flight plan will enable, the UAV to obtain images of the structure at the ground sampling distance.

The UAV can optionally provide the updated flight plan to the ground control system for review (block 910). The ground control system can model the updated flight plan, and determine whether any changes are to be made to the flight plan. An operator utilizing the ground control system can optionally provide approval to any modifications, or approval to the updated flight plan as determined by the UAV.

Actively Determining EM Field

Optionally, the UAV can actively monitor whether an electromagnetic field is negatively affecting, or is about to negatively affect, navigational functionality of the UAV. For instance, as the UAV navigates according to a flight plan (e.g., a flight plan to inspect a transmission tower, or an arbitrary flight plan), the UAV can determine whether an active electromagnetic source is interfering with a magnetometer utilized by the UAV for navigation. Since a transmission tower can, as described above, generate magnetic fields, as the UAV navigates closer to the tower, the magnetometer of the UAV can be negatively affected to point away from Earth's magnetic north. To determine whether a magnetic field (e.g., for instance from a transmission tower) is (1) existent and (2) negatively affecting the UAV, the UAV can compare expected flight information to actual flight information. As an example, the UAV can modify its course based on a magnetic field causing the magnetometer to shift (e.g., the UAV will correct its course based on a shifting magnetic north). The UAV can utilize flight surface information, such as attitude information, GNSS information, to model expected behavior. For instance if the UAV suddenly starts to descend, modify its attitude, or move away from GNSS coordinates associated with a flight path, when it's expected to remain stable along a flight pattern, the UAV can determine the unexpected behavior. The UAV can then determine whether the measured behavior is correlated with a direction indicated by the magnetometer. That is, the UAV can determine whether the flight behavior it is experiencing can be attributed to a change in direction of magnetic north.

The UAV may have an onboard Gauss meter, Tesla meter, or other device or sensor to measure magnetic fields. During navigation of the UAV around a structure, for example a power substation, a transmission tower, power lines, or cell tower, the UAV may periodically monitor the magnetic field of the structure. The UAV, or an outside system, may adjust the standoff distance according to the techniques described herein based on the magnetic field. The UAV may be configured to inhibit flight of the UAV into or towards a magnetic field when a threshold level of the field is above a particular threshold, such as 5 Teslas. The UAV may communicate with a ground control station and provide magnetic field readings to the ground control station. These field readings may be displayed in absolute measurement values or relative terms, such a graph indicating the strength of the field. Moreover, a display of the magnetic field may be displayed on the GCS. The UAV may communicate to the GCS geospatial locations with associated magnetic field measurements. With an adequate number of geospatial locations, and the associated magnetic field readings, the GCS may display a magnetic field map. The magnetic field measurements may be logged and later provided to a separate system for subsequent use. The UAV may trigger the Gauss meter or Tesla meter to obtain a magnetic field reading when the magnetometer detects a directional change.

UAV Block Diagram

Figure 10:
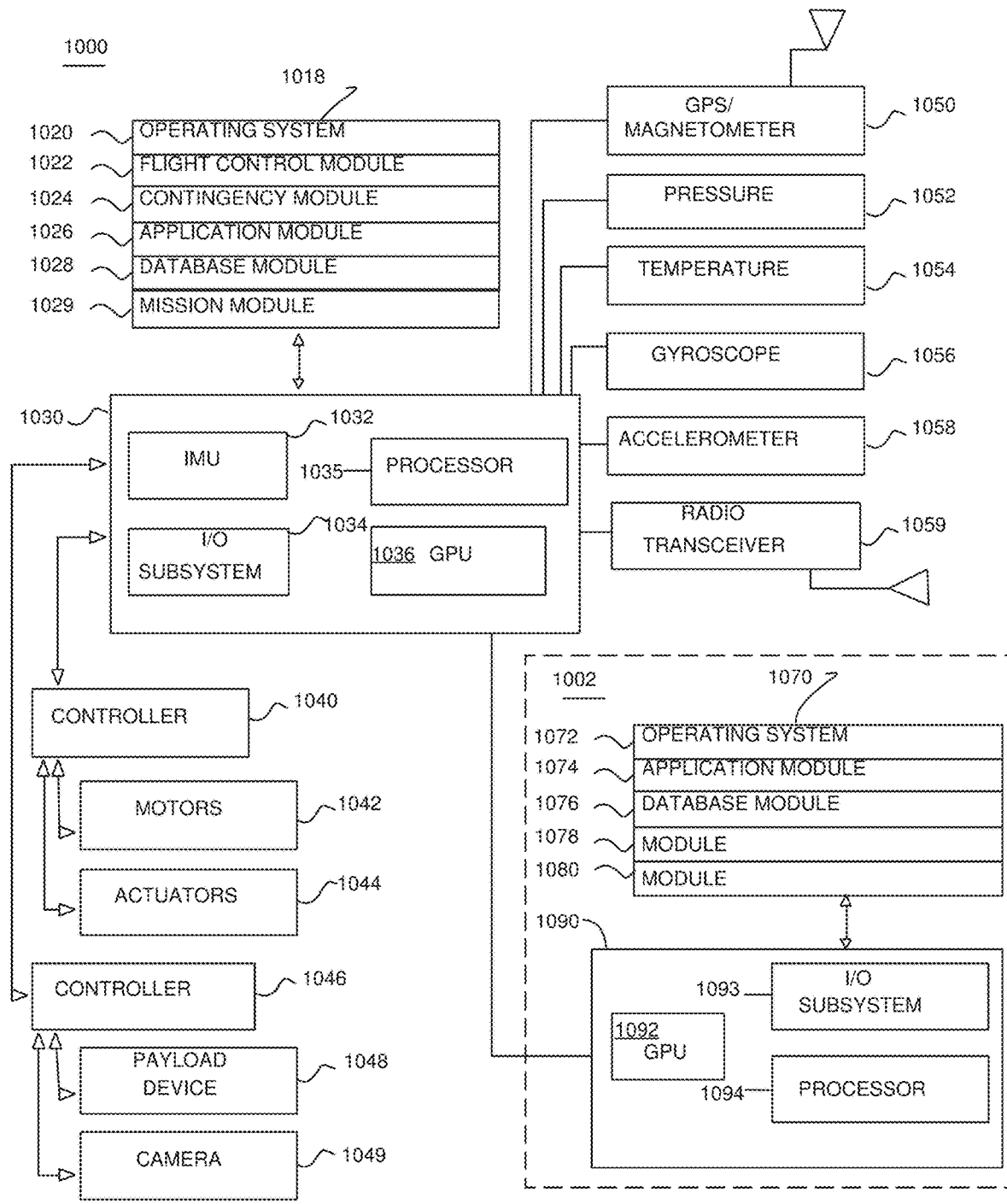
FIG. 10 illustrates a block diagram of an example Unmanned Aerial Vehicle (UAV) architecture for implementing the features and processes described herein.

FIG. 10 illustrates a block diagram of an example Unmanned Aerial Vehicle (UAV) architecture for implementing the features and processes described herein. A UAV primary processing system 1000 can be a system of one or more computers, or software executing on a system of one or more computers, which is in communication with, or maintains, one or more databases. The UAV primary processing system 1000 can be a system of one or more processors 1035, graphics processors 1036, I/O subsystem 1034, logic circuits, analog circuits, associated volatile and/or non-volatile memory, associated input/output data ports, power ports, etc., and/or one or more software processing executing one or more processors or computers. Memory 1018 may include non-volatile memory, such as one or more magnetic disk storage devices, solid state hard drives, or flash memory. Other volatile memory such a RAM, DRAM, SRAM may be used for temporary storage of data while the UAV is operational. Databases may store information describing UAV flight operations, flight plans, contingency events, geofence information, component information, and other information.

The UAV processing system may be coupled to one or more sensors, such as GPS receivers 1050, gyroscopes 1056, accelerometers 1058, pressure sensors (static or differential) 1052, current sensors, voltage sensors, magnetometer, hydrometer, and motor sensors. The UAV may use an inertial measurement unit (IMU) 1032 for use in navigation of the UAV. Sensors can be coupled to the processing system, or to controller boards coupled to the UAV processing system. One or more communication buses, such as a CAN bus, or signal lines, may couple the various sensor and components.

Various sensors, devices, firmware and other systems may be interconnected to support multiple functions and operations of the UAV. For example, the UAV primary processing system 1000 may use various sensors to determine the vehicle's current geo-spatial location, attitude, altitude, velocity, direction, pitch, roll, yaw and/or airspeed and to pilot the vehicle along a specified route and/or to a specified location and/or to control the vehicle's attitude, velocity, altitude, and/or airspeed (optionally even when not navigating the vehicle along a specific path or to a specific location).

The flight control module 1022 handles flight control operations of the UAV. The module interacts with one or more controllers 8100 that control operation of motors 1042 and/or actuators 1044. For example, the motors may be used for rotation of propellers, and the actuators may be used for flight surface control such as ailerons, rudders, flaps, landing gear, and parachute deployment.

The contingency module 1024 monitors and handles contingency events. For example, the contingency module may detect that the UAV has crossed a border of a geofence, and then instruct the flight control module to return to a predetermined landing location. Other contingency criteria may be the detection of a low battery or fuel state, or malfunctioning of an onboard sensor, motor, or a deviation from the flight plan. The foregoing is not meant to be limiting, as other contingency events may be detected. In some instances, if equipped on the UAV, a parachute may be deployed if the motors or actuators fail.

The mission module 1029 processes the flight plan, waypoints, and other associated information with the flight plan as provided to the UAV in the flight package. The mission module 1029 works in conjunction with the flight control module. For example, the mission module may send information concerning the flight plan to the flight control module, for example lat/long waypoints, altitude, flight velocity, so that the flight control module can autopilot the UAV.

The UAV may have various devices connected to it for data collection. For example, photographic camera 1049, video cameras, infra-red camera, multispectral camera, and Lidar, radio transceiver, sonar, TCAS (traffic collision avoidance system). Data collected by the devices may be stored on the device collecting the data, or the data may be stored on non-volatile memory 1018 of the UAV processing system 1000.

The UAV processing system 1000 may be coupled to various radios, and transmitters 1059 for manual control of the UAV, and for wireless or wired data transmission to and from the UAV primary processing system 1000, and optionally the UAV secondary processing system 1002. The UAV may use one or more communications subsystems, such as a wireless communication or wired subsystem, to facilitate communication to and from the UAV. Wireless communication subsystems may include radio transceivers, and infra-red, optical ultrasonic, electromagnetic devices. Wired communication systems may include ports such as Ethernet, USB ports, serial ports, or other types of port to establish a wired connection to the UAV with other devices, such as a ground control system, flight planning system, or other devices, for example a mobile phone, tablet, personal computer, display monitor, other other network-enabled devices. The UAV may use a light-weight tethered wire to a ground control station for communication with the UAV. The tethered wire may be removably affixed to the UAV, for example via a magnetic coupler.

Flight data logs may be generated by reading various information from the UAV sensors and operating system and storing the information in non-volatile memory. The data logs may include a combination of various data, such as time, altitude, heading, ambient temperature, processor temperatures, pressure, battery level, fuel level, absolute or relative position, GPS coordinates, pitch, roll, yaw, ground speed, humidity level, velocity, acceleration, contingency information. This foregoing is not meant to be limiting, and other data may be captured and stored in the flight data logs. The flight data logs may be stored on a removable media and the media installed onto the ground control system. Alternatively, the data logs may be wirelessly transmitted to the ground control system or to the flight planning system.

Modules, programs or instructions for performing flight operations, contingency maneuvers, and other functions may be performed with the operating system. In some implementations, the operating system 1020 can be a real time operating system (RTOS), UNIX, LINUX, OS X, WINDOWS, ANDROID or other operating system. Additionally, other software modules and applications may run on the operating system, such as a flight control module 1022, contingency module 1024, application module 1026, and database module 1028. Typically flight critical functions will be performed using the UAV processing system 1000. Operating system 1020 may include instructions for handling basic system services and for performing hardware dependent tasks.

In addition to the UAV primary processing system 1000, a secondary processing system 1002 may be used to run another operating system to perform other functions. A UAV secondary processing system 8102 can be a system of one or more computers, or software executing on a system of one or more computers, which is in communication with, or maintains, one or more databases. The UAV secondary processing system 1002 can be a system of one or more processors 1094, graphics processors 1092, I/O subsystem 894 logic circuits, analog circuits, associated volatile and/or non-volatile memory, associated input/output data ports, power ports, etc., and/or one or more software processing executing one or more processors or computers. Memory 1070 may include non-volatile memory, such as one or more magnetic disk storage devices, solid state hard drives, flash memory. Other volatile memory such a RAM, DRAM, SRAM may be used for storage of data while the UAV is operational.

Ideally modules, applications and other functions running on the secondary processing system 1002 will be non-critical functions in nature, that is if the function fails, the UAV will still be able to safely operate. In some implementations, the operating system 1072 can be based on real time operating system (RTOS), UNIX, LINUX, OS X, WINDOWS, ANDROID or other operating system. Additionally, other software modules and applications may run on the operating system 1072, such as an application module 1074, database module 1076. Operating system 1002 may include instructions for handling basic system services and for performing hardware dependent tasks.

Also, controllers 1046 may be used to interact and operate a payload device 1048, and other devices such as photographic camera 1049, video camera, infra-red camera, multispectral camera, stereo camera pair, Lidar, radio transceiver, sonar, laser ranger, altimeter, TCAS (traffic collision avoidance system), ADS-B (Automatic dependent surveillance-broadcast) transponder. Optionally, the secondary processing system 1002 may have coupled controllers to control payload devices.

Each of the processes, methods, instructions, applications and algorithms described in the preceding sections may be embodied in, and fully or partially automated by, code modules executed by one or more computer systems or computer processors comprising computer hardware. The code modules (or "engines") may be stored on any type of non-transitory computer-readable medium or computer storage device, such as hard drives, solid state memory, optical disc, and/or the like. The systems and modules may also be transmitted as generated data signals (for example, as part of a carrier wave or other analog or digital propagated signal) on a variety of computer-readable transmission mediums, including wireless-based and wired/cable-based mediums, and may take a variety of forms (for example, as part of a single or multiplexed analog signal, or as multiple discrete digital packets or frames). The processes and algorithms may be implemented partially or wholly in application-specific circuitry. The results of the disclosed processes and process steps may be stored, persistently or otherwise, in any type of non-transitory computer storage such as, for example, volatile or non-volatile storage.

User interfaces described herein are optionally presented (and user instructions may be received) via a user computing device using a browser, other network resource viewer, a dedicated application, or otherwise. Various features described or illustrated as being present in different embodiments or user interfaces may be combined into the same embodiment or user interface. Commands and information received from the user may be stored and acted on by the various systems disclosed herein using the processes disclosed herein. While the disclosure may reference to a user hovering over, pointing at, or clicking on a particular item, other techniques may be used to detect an item of user interest. For example, the user may touch the item via a touch screen, or otherwise indicate an interest. The user interfaces described herein may be presented on a user terminal, such as a laptop computer, desktop computer, tablet computer, smart phone, virtual reality headset, augmented reality headset, or other terminal type. The user terminals may be associated with user input devices, such as touch screens, microphones, touch pads, keyboards, mice, styluses, cameras, etc. While the foregoing discussion and figures may illustrate various types of menus, other types of menus may be used. For example, menus may be provided via a drop down menu, a tool bar, a pop up menu, interactive voice response system, or otherwise.

In general, the terms "engine" and "module", as used herein, refer to logic embodied in hardware or firmware, or to a collection of software instructions, possibly having entry and exit points, written in a programming language, such as, for example, Java, Lua, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software modules configured for execution on computing devices may be provided on a computer readable medium, such as a compact disc, digital video disc, flash drive, or any other tangible medium. Such software code may be stored, partially or fully, on a memory device of the executing computing device. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules described herein are preferably implemented as software modules, but may be represented in hardware or firmware. Generally, the modules described herein refer to logical modules that may be combined with other modules or divided into sub-modules despite their physical organization or storage. Electronic data sources can include databases, volatile/non-volatile memory, and any memory system or subsystem that maintains information.

The various features and processes described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "for example," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z to each be present.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The term "comprising" as used herein should be given an inclusive rather than exclusive interpretation. For example, a general purpose computer comprising one or more processors should not be interpreted as excluding other computer components, and may possibly include such components as memory, input/output devices, and/or network interfaces, among others.

While certain example embodiments have been described, these embodiments have been presented by way of example only, and are not intended to limit the scope of the disclosure. Nothing in the description is intended to imply that any particular element, feature, characteristic, step, module, or block is necessary or indispensable. The novel methods and systems described herein may be embodied in a variety of other forms; furthermore, various omissions, substitutions, and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved, as would be understood by those skilled in the art.

It should be emphasized that many variations and modifications may be made to the to the above-described embodiments, the elements of which are to be understood as being among other acceptable examples. All such modifications and variations are intended to be included herein within the scope of the disclosure. The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated.

What is claimed is:

1. An unmanned aerial vehicle (UAV) system comprising:
    one or more processors comprising hardware, the one or more processors configured to perform operations comprising:
        determining a standoff distance from a structure based on an electromagnetic field of the structure, wherein the standoff distance is a distance the UAV is to remain from the structure while the UAV is navigating;
        determining a flight pattern for the UAV to implement, the flight pattern configured such that the UAV remains at least the determined standoff distance from the structure, and the flight pattern including a predetermined path for the UAV to follow;
        navigating the UAV according to the determined flight pattern; and
        obtaining sensor data of the structure at multiple aerial positions about the structure.

2. The system of claim 1, the operations further comprising:
    during navigation of the UAV, increasing the standoff distance from the structure when the system determines an increased magnetic field strength of the structure.

3. The system of claim 1, wherein determining a standoff distance from the structure comprises:
    navigating the UAV to a first altitude above one or more conductors carried by the structure;
    navigating the UAV to descend from the first altitude towards the conductors;
    determining information indicative of an electromagnetic field associated with the one or more conductors;
    determining, using the information, a second altitude at which the electromagnetic field associated with the one or more conductors affects navigation of the UAV; and
    setting the standoff distance based on the second altitude.

4. The system of claim 1, wherein determining a standoff distance from the structure comprises:
    obtaining a magnetic field measurement of the structure;
    determining a distance from the structure and a location where the measurement was taken; and
    using a model to select a distance for the standoff distance where the selected distance would be at or below a predetermined threshold value.

5. The system of claim 1, the operations further comprising:
    preventing flight of the UAV closer to the structure than the standoff distance.

6. The system of claim 1, the operations further comprising:

periodically determining a magnetic interference of the structure; and adjusting the standoff distance based on the periodically determined magnetic interference.

7. The system of claim 1, the operations further comprising:

measuring by the UAV, a magnetic field strength of a magnetic field of the structure; and obtaining the geospatial location of the UAV and the magnetic field measurement.

8. The system of claim 1, the operations further comprising:

determining that the UAV has navigated to a distance closer to the structure than the standoff distance; and causing the UAV to perform a contingency operation.

9. The system of claim 1, wherein determining a standoff distance from the structure comprises:

receiving, via a user interface of the system, a numerical value for the standoff distance.

10. The system of claim 1, wherein determining the standoff distance is based on physical information of a model of the structure.

11. The system of claim 1, wherein determining a standoff distance from the structure comprises:

determining the standoff distance based upon a model describing the electromagnetic field of the structure; and utilizing the model to determine different standoff distances at various locations along the flight pattern.

12. A non-transitory computer storage medium comprising instructions that when executed by one or more processors, cause the one or more processors to perform operations comprising:

determining a standoff distance from a structure based on an electromagnetic field of the structure, wherein the standoff distance is a distance an unmanned aerial vehicle (UAV) is to remain from the structure while the UAV is navigating;

determining a flight pattern for the UAV to implement, the flight pattern configured such that the UAV remains at least the determined standoff distance from the structure, and the flight pattern including a predetermined path for the UAV to follow;

navigating the UAV according to the determined flight pattern; and obtaining sensor data of the structure at multiple aerial positions about the structure.

13. The non-transitory computer storage medium of claim 12, the operations further comprising:

during navigation of the UAV, increasing the standoff distance from the structure when the system determines an increased magnetic field strength of the structure.

14. The non-transitory computer storage medium of claim 12, wherein determining a standoff distance from the structure comprises:

navigating the UAV to a first altitude above one or more conductors carried by the structure;

navigating the UAV to descend from the first altitude towards the conductors;

determining information indicative of an electromagnetic field associated with the one or more conductors;

determining, using the information, a second altitude at which the electromagnetic field associated with the one or more conductors affects navigation of the UAV; and setting the standoff distance based on the second altitude.

15. The non-transitory computer storage medium of claim 12, wherein determining a standoff distance from the structure comprises:

obtaining a magnetic field measurement of the structure;

determining a distance from the structure and a location where the measurement was taken; and using a model to select a distance for the standoff distance where the selected distance would be at or below a predetermined threshold value.

16. The non-transitory computer storage medium of claim 12, the operations further comprising:

preventing flight of the UAV closer to the structure than the standoff distance.

17. The non-transitory computer storage medium of claim 12, the operations further comprising:

periodically determining a magnetic interference of the structure; and adjusting the standoff distance based on the periodically determined magnetic interference.

18. The non-transitory computer storage medium of claim 12, the operations further comprising:

measuring by the UAV, a magnetic field strength of a magnetic field of the structure; and obtaining the geospatial location of the UAV and the magnetic field measurement.

19. The non-transitory computer storage medium of claim 12, the operations further comprising:

determining that the UAV has navigated to a distance closer to the structure than the standoff distance; and causing the UAV to perform a contingency operation.

20. The non-transitory computer storage medium of claim 12, wherein determining a standoff distance from the structure comprises:

receiving, via a user interface of the system, a numerical value for the standoff distance.

21. The non-transitory computer storage medium of claim 12, wherein determining the standoff distance is based on physical information of a model of the structure.

22. The non-transitory computer storage medium of claim 12, wherein determining a standoff distance from the structure comprises:

determining the standoff distance based upon a model describing the electromagnetic field of the structure; and utilizing the model to determine different standoff distances at various locations along the flight pattern.

23. A computerized method performed by an unmanned aerial vehicle (UAV) system, the method comprising:

determining a standoff distance from a structure based on an electromagnetic field of the structure, wherein the standoff distance is a distance the UAV is to remain from the structure while the UAV is navigating;

determining a flight pattern for the UAV to implement, the flight pattern configured such that the UAV remains at least the determined standoff distance from the structure, and the flight pattern including a predetermined path for the UAV to follow;

navigating the UAV according to the determined flight pattern; and obtaining sensor data of the structure at multiple aerial positions about the structure.

24. The computerized method of claim 23, further comprising:

during navigation of the UAV, increasing the standoff distance from the structure when the system determines an increased magnetic field strength of the structure.

25. The computerized method of claim 23, wherein determining a standoff distance from the structure comprises:
  navigating the UAV to a first altitude above one or more conductors carried by the structure;
  navigating the UAV to descend from the first altitude towards the conductors;
  determining information indicative of an electromagnetic field associated with the one or more conductors;
  determining, using the information, a second altitude at which the electromagnetic field associated with the one or more conductors affects navigation of the UAV; and
  setting the standoff distance based on the second altitude.

26. The computerized method of claim 23, wherein determining a standoff distance from the structure comprises:
  obtaining a magnetic field measurement of the structure;
  determining a distance from the structure and a location where the measurement was taken; and
  using a model to select a distance for the standoff distance where the selected distance would be at or below a predetermined threshold value.

27. The computerized method of claim 23, further comprising:
  preventing flight of the UAV closer to the structure than the standoff distance.

28. The computerized method of claim 23, further comprising:
  periodically determining a magnetic interference of the structure; and
  adjusting the standoff distance based on the periodically determined magnetic interference.

29. The computerized method of claim 23, further comprising:
  measuring by the UAV, a magnetic field strength of a magnetic field of the structure; and
  obtaining the geospatial location of the UAV and the magnetic field measurement.

30. The computerized method of claim 23, further comprising:
  determining that the UAV has navigated to a distance closer to the structure than the standoff distance; and
  causing the UAV to perform a contingency operation.

31. The computerized method of claim 23, wherein determining a standoff distance from the structure comprises:
  receiving, via a user interface of the system, a numerical value for the standoff distance.

32. The computerized method of claim 23, wherein determining the standoff distance is based on physical information of a model of the structure.

33. The computerized method of claim 23, wherein determining a standoff distance from the structure comprises:
  determining the standoff distance based upon a model describing the electromagnetic field of the structure; and
  utilizing the model to determine different standoff distances at various locations along the flight pattern.

* * * * *